US012317653B2

(12) United States Patent
Chen et al.

(10) Patent No.: US 12,317,653 B2
(45) Date of Patent: May 27, 2025

(54) METHOD OF MANUFACTURING LED DISPLAY PANEL

(71) Applicant: DISCO CORPORATION, Tokyo (JP)

(72) Inventors: Zhiwen Chen, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 603 days.

(21) Appl. No.: 17/658,743

(22) Filed: Apr. 11, 2022

(65) Prior Publication Data

US 2022/0336715 A1    Oct. 20, 2022

(30) Foreign Application Priority Data

Apr. 16, 2021   (JP) .................................. 2021-069659

(51) Int. Cl.
*H10H 20/85*     (2025.01)
*H01L 25/075*    (2006.01)
(Continued)

(52) U.S. Cl.
CPC ..... *H10H 20/8506* (2025.01); *H01L 25/0753* (2013.01); *H10H 20/01* (2025.01);
(Continued)

(58) Field of Classification Search
CPC ... H01L 33/486; H01L 27/156; H01L 33/005; H01L 33/382; H01L 2933/0016; H01L 21/67092; H01L 21/67115; H01L 21/67144; H01L 21/67718; H01L 25/167; H01L 33/0095; H01L 2933/0066;
(Continued)

(56) References Cited

U.S. PATENT DOCUMENTS 10,096,740 B1 * 10/2018 Chen ...................... H01L 33/36
11,417,627 B2 * 8/2022 Koo ....................... H01L 24/27
(Continued)

FOREIGN PATENT DOCUMENTS

CN      111477650 A    7/2020
JP       10305420 A    11/1998
(Continued)

OTHER PUBLICATIONS

Office Action issued in counterpart Japanese patent application No. 2021-069659, dated Sep. 24, 2024.

*Primary Examiner* — Michael M Trinh
(74) *Attorney, Agent, or Firm* — GREER BURNS & CRAIN, LTD.

(57) ABSTRACT

A method of manufacturing an LED display panel includes holding an LED wafer on a first holding unit, holding a circuit board on a second holding unit, positioning electrodes of the board at positions corresponding to electrode layers of the wafer while a face side of the board and a face side of the wafer are facing each other, joining the electrode layers and the electrodes to each other by applying a laser beam having a wavelength absorbable by a reverse side of one of the board and the wafer, to the reverse side of the one of the board and the wafer, thereby heating at least either the electrode layers or the electrodes, and breaking the buffer layers by applying a pulsed laser beam having a wavelength transmittable through a substrate of the wafer, to the buffer layers through a reverse side of the wafer.

2 Claims, 16 Drawing Sheets

(51) Int. Cl.
*H10H 20/01* (2025.01)
*H10H 20/831* (2025.01)
*H10H 29/14* (2025.01)
*H01L 25/16* (2023.01)

(52) U.S. Cl.
CPC ...... *H10H 20/8312* (2025.01); *H10H 29/142* (2025.01); *H01L 25/167* (2013.01); *H10H 20/032* (2025.01); *H10H 20/0364* (2025.01)

(58) Field of Classification Search
CPC ............ H01L 25/0753; H01L 33/0093; B23K 26/0622; B23K 26/082; B23K 26/38; H10H 20/01; H10H 20/8506; H10H 20/8502; H10H 20/8504; H10H 20/8508; H10H 29/8506; H10H 29/8508; H10H 29/032; H10H 29/0364; H10H 20/8312; H10H 20/032; H10H 20/0364; H10H 20/018; H10H 20/019; H10H 29/142; H10H 29/011; H10H 29/14; H10H 29/30; H10H 29/32; H10H 29/34; H10H 29/345; H10H 29/352; H10H 29/362; H10H 29/37; H10H 29/39; H10H 29/41; H10H 29/45; H10H 29/49; H10H 29/8517; H10H 29/8552; H10H 29/922; H10H 29/942; H10H 29/962
See application file for complete search history.

(56) References Cited

U.S. PATENT DOCUMENTS

| | | | |
|---|---|---|---|
| 2017/0236811 A1* | 8/2017 | Pokhriyal | ............. H01L 33/005 257/91 |
| 2017/0330857 A1* | 11/2017 | Zou | ........................ H01L 24/81 |
| 2020/0243478 A1 | 7/2020 | Hsieh et al. | |

FOREIGN PATENT DOCUMENTS

| | | |
|---|---|---|
| JP | 2018194718 A | 12/2018 |
| KR | 1020200104674 A | 9/2020 |

* cited by examiner

METHOD OF MANUFACTURING LED DISPLAY PANEL

BACKGROUND OF THE INVENTION

Field of the Invention

The present invention relates to a method of manufacturing a light emitting diode (LED) display panel by placing a plurality of LEDs in a predetermined layout on a circuit board having a circuit for driving the LEDs.

Description of the Related Art

There has been known in the art a technology for applying, to a wafer, a laser beam having a wavelength transmittable through the wafer to divide the wafer into a plurality of chips (see, for example, Japanese Patent Laid-open No. Hei 10-305420). According to the technology, in a case where LEDs, for example, are to be manufactured, a wafer that has a crystalline substrate, a buffer layer formed on the substrate, and an epitaxial growth layer formed on the buffer layer is divided into a plurality of LEDs by a laser beam applied thereto. As the crystalline substrate, a sapphire substrate or a silicon carbide (SiC) substrate is used, for example. The epitaxial growth layer includes an N-type semiconductor layer, a light-emitting layer, and a P-type semiconductor layer. A cathode electrode layer is formed on the N-type semiconductor layer, whereas an anode electrode layer is formed on the P-type semiconductor layer.

A grid of projected dicing lines are established on the epitaxial growth layer. When the epitaxial growth layer is cut along the projected dicing lines, the epitaxial growth layer is divided into a plurality of LEDs each having an epitaxial growth layer and an electrode layer. The plurality of LEDs are, for example, red LEDs for emitting red light. Further, a plurality of blue LEDs for emitting blue light are manufactured from another wafer. Moreover, a plurality of green LEDs for emitting green light are manufactured from still another wafer.

Each of the LEDs is a rectangular micro-LED having a size of 10 μm on each side as viewed in plan. The LEDs will be incorporated as red (R), green (G), and blue (B) pixels in a display panel for use in a display device such as a micro-LED display. For fabricating a display panel, LEDs need to be secured to a circuit board made of glass or the like while being electrically connected thereto. In order to secure and electrically connect the LEDs to the circuit board, while the electrode layers of the LEDs and electrodes on the circuit board are held in contact with each other, a laser beam having a wavelength transmittable through the circuit board is applied through the circuit board to the electrodes successively.

After the electrodes on the circuit board have temporarily been melted by the applied laser beam, they are solidified, whereupon the electrodes on the circuit board and the electrode layers of the LEDs are electrically connected to each other (electrode joining step). After the electrode joining step, a buffer layer breaking step is carried out to break the buffer layer so as to separate the LEDs from the circuit board. In the buffer layer breaking step, a laser beam having a wavelength transmittable through the wafer is applied through the wafer to the buffer layer, thereby breaking the buffer layer. Thereafter, the wafer is lifted and peeled off from the circuit board (see, for example, Japanese Patent Laid-open No. 2018-194718).

SUMMARY OF THE INVENTION

Inasmuch as the laser beam whose wavelength is transmittable through the circuit board is used in the electrode joining step, metal interconnects or the like having a high rate of absorption of the laser beam cannot be placed in the path of the laser beam. Therefore, the conventional technology has posed a problem in that the degree of freedom in designing circuit boards is low. In view of the above problem, it is an object of the present invention to provide a method of manufacturing an LED display panel with an increased degree of freedom in designing circuit boards.

In accordance with an aspect of the present invention, there is provided a method of manufacturing an LED display panel by placing a plurality of LEDs in a predetermined layout on a circuit board having a circuit for driving the LEDs. The method includes an LED wafer holding step of holding, on a first holding unit, an LED wafer on which a plurality of areas demarcated on a face side of a substrate by a plurality of element separating lines are defined, the LED wafer including an LED that is disposed in each of the areas with a buffer layer interposed therebetween and an electrode layer that is disposed on the LED on a side opposite to the buffer layer, a circuit board holding step of holding, on a second holding unit, a circuit board having a plurality of electrodes arranged in rows and columns on a face side thereof, a positioning step of positioning each of the electrodes of the circuit board at a position corresponding to the electrode layer of the LED wafer while the face side of the circuit board and the face side of the substrate of the LED wafer are facing each other, an electrode joining step of joining the electrode layer of the LED wafer and the electrode of the circuit board to each other by applying a laser beam having a wavelength absorbable by a reverse side of one of the circuit board and the LED wafer, to the reverse side of the one of the circuit board and the LED wafer with the face sides thereof facing each other in the positioning step, thereby heating at least either the electrode layer of the LED wafer or the electrode of the circuit board in an irradiation area irradiated by the laser beam, a buffer layer breaking step of breaking the buffer layer by applying a pulsed laser beam having a wavelength transmittable through the substrate of the LED wafer, to the buffer layer through a reverse side of the LED wafer that faces the circuit board in the positioning step, and a peeling step of peeling off the substrate from the LED after the buffer layer breaking step.

Preferably, the electrode joining step includes a step of simultaneously heating at least either a plurality of the electrode layers of the LED wafer or the plurality of electrodes of the circuit board by using a spatial light modulator to vary the power density distribution of the laser beam within the irradiation area irradiated by the laser beam.

The method of manufacturing an LED display panel according to the aspect of the present invention has the electrode joining step of joining the electrode layers and the electrodes to each other by applying a pulsed laser beam having a wavelength absorbable by a reverse side of one of the circuit board and the LED wafer, to the reverse side of the one of the circuit board and the LED wafer, thereby heating at least either the electrode layers of the LED wafer or the electrodes of the circuit board in the irradiation area irradiated by the laser beam. Therefore, even if metal interconnects, etc., having a high rate of absorption of the laser beam are disposed on the circuit board, the electrodes, etc., can appropriately be heated. Consequently, the degree of freedom in designing the circuit board is increased compared with a case where the electrode joining step is carried out by using a laser beam having a wavelength transmittable through the circuit board.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described hereinbelow with reference to the accompanying drawings.

First Embodiment

Figure 1:
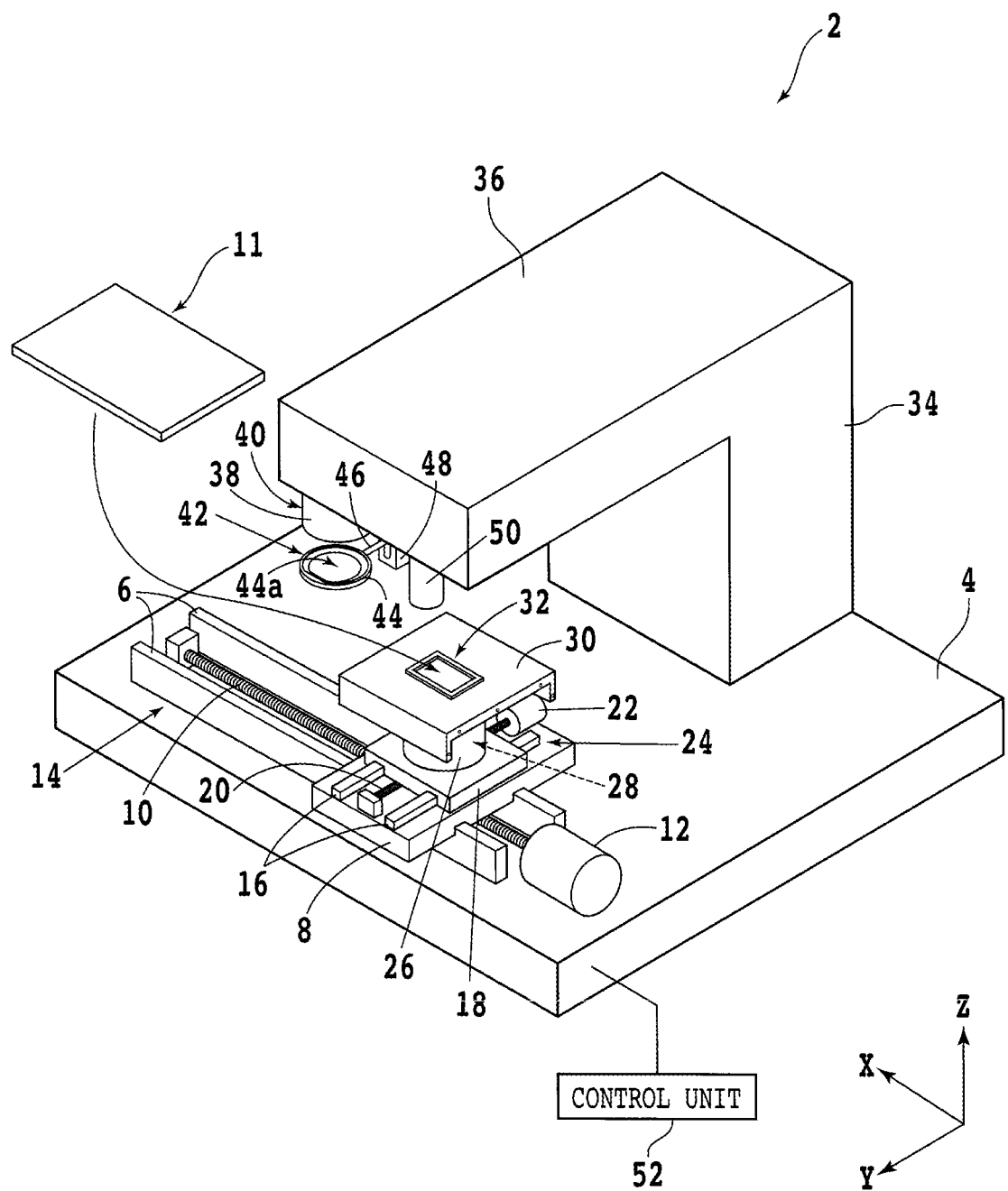
FIG. 1 is a perspective view of a laser processing apparatus.

A laser processing apparatus 2 (see FIG. 1) that is used in a method of manufacturing an LED display panel 27 (see FIG. 11) according to a first embodiment of the present invention will be described below. FIG. 1 illustrates the laser processing apparatus 2 in perspective. In FIG. 1, the laser processing apparatus 2 is illustrated in an XYZ coordinate system having an X-axis, a Y-axis, and a Z-axis that extend perpendicularly to each other. The X-axis and the Y-axis jointly define an X-Y plane that lies horizontally, and the Z-axis extends vertically. The laser processing apparatus 2 has a base 4 that supports thereon various components of the laser processing apparatus 2.

A pair of guide rails 6 extending along the X-axis are fixedly mounted on an upper surface of the base 4. An X-axis movable plate 8 is slidably mounted on the guide rails 6 for sliding movement along the X-axis thereon. A nut, not illustrated, is mounted on a lower surface of the X-axis movable plate 8. The nut is operatively threaded over a screw shaft 10 that extends along the X-axis and that is disposed between the guide rails 6, with balls, not illustrated, that are movably interposed between the nut and the screw shaft 10. The screw shaft 10 has an end coupled to a stepping motor 12. When the stepping motor 12 is energized, it rotates the screw shaft 10 about its central axis, causing the nut to move the X-axis movable plate 8 along the X-axis. The guide rails 6, the X-axis movable plate 8, the screw shaft 10, and the stepping motor 12 jointly make up an X-axis moving unit 14.

A pair of guide rails 16 extending along the Y-axis are fixedly mounted on an upper surface of the X-axis movable plate 8. A Y-axis movable plate 18 is slidably mounted on the guide rails 16 for sliding movement along the Y-axis thereon. A nut, not illustrated, is mounted on a lower surface of the Y-axis movable plate 18. The nut is operatively threaded over a screw shaft 20 that extends along the Y-axis and that is disposed between the guide rails 16, with balls, not illustrated, that are movably interposed between the nut and the screw shaft 20. The screw shaft 20 has an end coupled to a stepping motor 22. When the stepping motor 22 is energized, it rotates the screw shaft 20 about its central axis, causing the nut to move the Y-axis movable plate 18 along the Y-axis. The guide rails 16, the Y-axis movable plate 18, the screw shaft 20, and the stepping motor 22 jointly make up a Y-axis moving unit 24.

Figure 15:
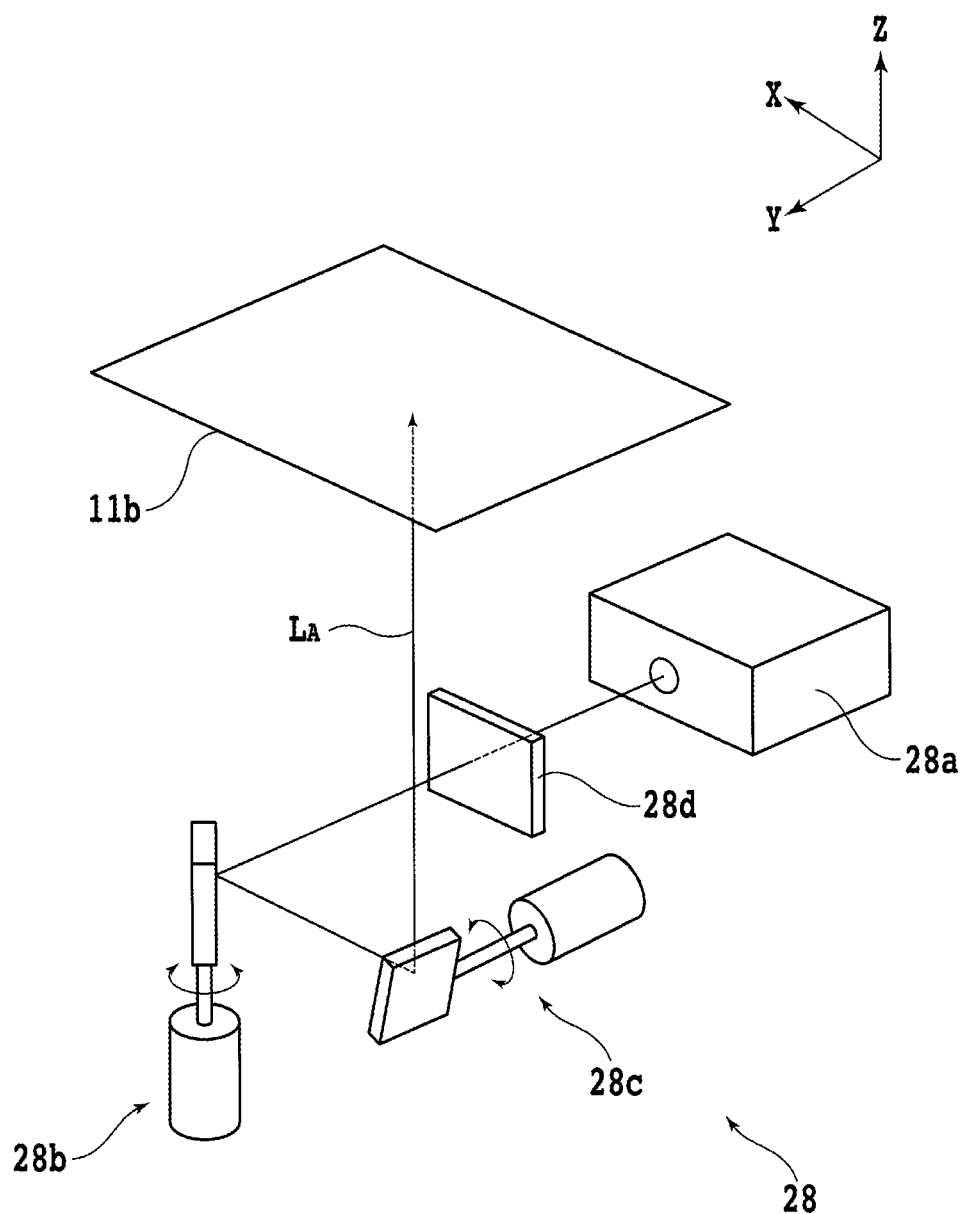
FIG. 15 is a perspective view of a laser beam applying unit according to a fifth embodiment of the present invention.

A cylindrical support post 26 is mounted on an upper surface of the Y-axis movable plate 18. The support post 26 houses therein a laser beam applying unit 28 having a laser oscillator 28a (see FIG. 15), etc. As illustrated in FIG. 15, a laser beam $L_A$ emitted from the laser oscillator 28a is reflected by a Y scan mirror 28b and an X scan mirror 28c of a galvanoscanner.

The laser beam $L_A$ reflected by the Y scan mirror 28b and the X scan mirror 28c is directed upwardly so as to be focused onto a predetermined plane by a beam condenser, not illustrated, having an fθ lens. The laser beam $L_A$ has a wavelength absorbable by a circuit board 11 to be described later. According to the present embodiment, the laser beam $L_A$ is not of a pulsed wave but of a continuous wave, and is used for laser assisted bonding (LAB) in an electrode joining step S40 to be described later.

As illustrated in FIG. 1, a holding table 30 that is of a rectangular shape as viewed in plan is mounted on an upper end of the support post 26. The holding table 30 includes, at the center thereof, a rectangular board holding frame, i.e., a second holding unit, 32 for holding the circuit board 11 under suction thereon. The holding table 30 is rotatable about a rotational axis that is substantially parallel to the Z-axis, by power from a rotary actuator, not illustrated, that is disposed in the support post 26. The holding table 30 is rotated to adjust the orientation of the board holding frame 32 in a horizontal plane.

Figure 5:
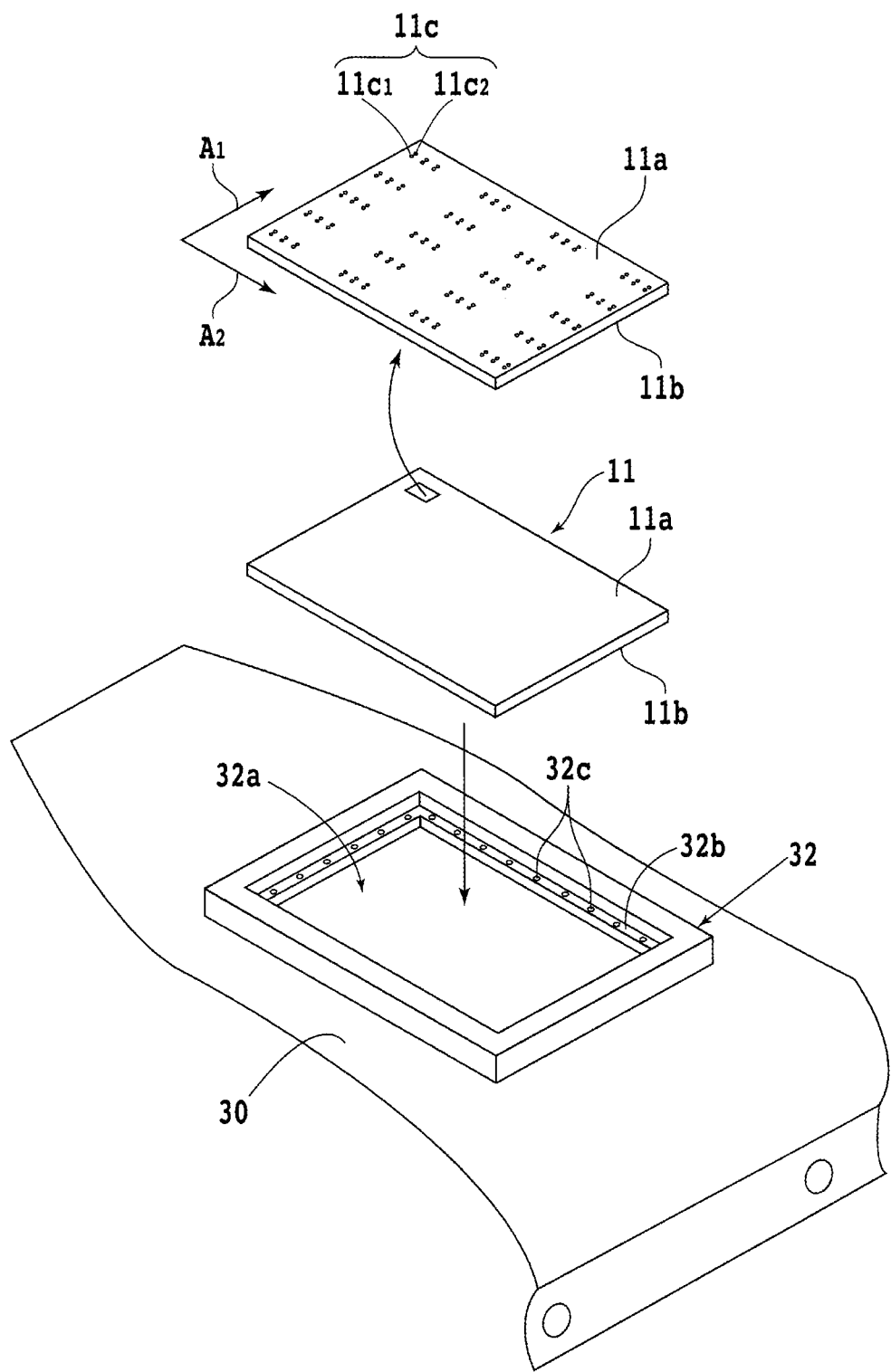
FIG. 5 is a perspective view illustrating a circuit board holding step.

As illustrated at an enlarged scale in FIG. 5, the board holding frame 32 has a rectangular opening 32a defined therein by edge portions having steps 32b. The steps 32b have a plurality of suction ports 32c defined in upper surfaces thereof at predetermined spaced intervals therealong. The suction ports 32c are connected to a suction source, not illustrated, such as an ejector through a predetermined fluid channel, not illustrated. When the circuit board 11 is placed on the steps 32b of the board holding frame 32 and a negative pressure generated by the suction source is transmitted through the fluid channel to the suction ports 32c, the circuit board 11 is held under suction on the board holding frame 32.

The circuit board 11 will further be described below with reference to FIG. 5. The circuit board 11 has circuits, not illustrated, for driving a plurality of LEDs to be described later. The circuit board 11 has a base substrate. On one surface of the base substrate, i.e., on a face side 11a of the circuit board 11, there is formed a function layer including a plurality of electrically conductive layers made of metal and insulating layers interposed between the electrically conductive layers. The function layer includes the circuits. In a case where the base substrate is a glass substrate, a function layer including thin-film transistors (TFTs) is formed on one surface of the glass substrate. Alternatively, in a case where the base substrate is a silicon substrate, a function layer including metal-oxide-semiconductor field-effect transistors (MOSFETs) is formed on one surface of the silicon substrate.

A plurality of interconnects for supplying drive signals to TFTs or MOSFETs are formed on the circuit board 11 and extend to peripheral portions of the circuit board 11. Driver circuits are electrically connected to the interconnects. For example, the driver circuits are formed on a board different from the circuit board 11 and added as external circuits to the circuit board 11. However, the driver circuits may integrally be formed with the circuit board 11 on the peripheral portions thereof. Electrode units 11c are exposed on the outermost surface of the function layer.

The electrode units 11c include exposed electrodes $11c_1$ and $11c_2$. The electrodes $11c_1$ and $11c_2$ are, for example, copper (Cu) bumps or solder bumps. For example, the electrodes $11c_1$ are electrically connected to the anode electrodes of LEDs, and the electrodes $11c_2$ are electrically connected to the cathode electrodes of the LEDs. The electrode units 11c are arranged in rows and columns on the face side 11a. In FIG. 5, a direction along shorter sides of the face side 11a is referred to as a row direction $A_1$ along which the electrode units 11c are arranged in rows, and a direction along longer sides of the face side 11a is referred to as a column direction $A_2$ along which the electrode units 11c are arranged in columns. Alternatively, the direction along the shorter sides of the face side 11a may be referred to as a column direction, and the direction along the longer sides of the face side 11a may be referred to as a row direction.

The wavelength of the laser beam $L_A$ is set to a value transmittable by the base substrate of the circuit board 11. For example, in a case where the base substrate is made of glass or sapphire, the wavelength of the laser beam $L_A$ is set to a value of 100 nm or less. In a case where the base substrate is made of monocrystalline silicon, the wavelength of the laser beam $L_A$ is set to a value in the range of 400 nm to 1100 nm. Note that, according to the present embodiment, the base substrate of the circuit board 11 is made of monocrystalline silicon.

If a laser beam whose wavelength is transmittable through the circuit board 11 is applied from a reverse side 11b of the circuit board 11 through the circuit board 11 to the electrodes $11c_1$ and $11c_2$ positioned on the face side 11a, then metal interconnects or the like having a high rate of absorption of the laser beam cannot be placed in the path of the laser beam. According to the present embodiment, however, since the laser beam $L_A$ whose wavelength is absorbable by the circuit board 11 is used, when the electrodes $11c_1$ and $11c_2$ are heated, metal interconnects or the like provided on the circuit board 11 are subjected to less limitations. Consequently, the degree of freedom in designing the circuit board 11 is increased. An alignment mark 11d (FIG. 7A) is formed on an outer peripheral portion of the face side 11a of the circuit board 11. The alignment mark 11d is a protruding pattern having a predetermined shape, though it may be a recess pattern.

Other components of the laser processing apparatus 2 will be described below with reference to FIG. 1. A vertical prismatic column 34 is mounted on the upper surface of the base 4 behind the X-axis moving unit 14 and the Y-axis moving unit 24. A horizontal beam 36 has an end fixed to an upper end portion of the column 34. A laser oscillator, not illustrated, is housed in the column 34 or the beam 36. A laser beam $L_B$ (see FIG. 8B) emitted from the laser oscillator is reflected by a galvanoscanner, not illustrated, and is applied to a beam condenser 38 mounted on a lower surface of a distal end portion of the beam 36. The beam condenser 38 includes an fθ lens, not illustrated, that converges the laser beam $L_B$ onto a predetermined plane below the beam condenser 38.

The beam condenser 38, the laser oscillator, and the galvanoscanner jointly make up a laser beam applying unit 40. The laser beam $L_B$ that is emitted downwardly from the beam condenser 38 has a wavelength that is transmittable through a monocrystalline substrate 15 (see FIG. 3A) of a red LED wafer 13 to be described later.

Figure 3A:
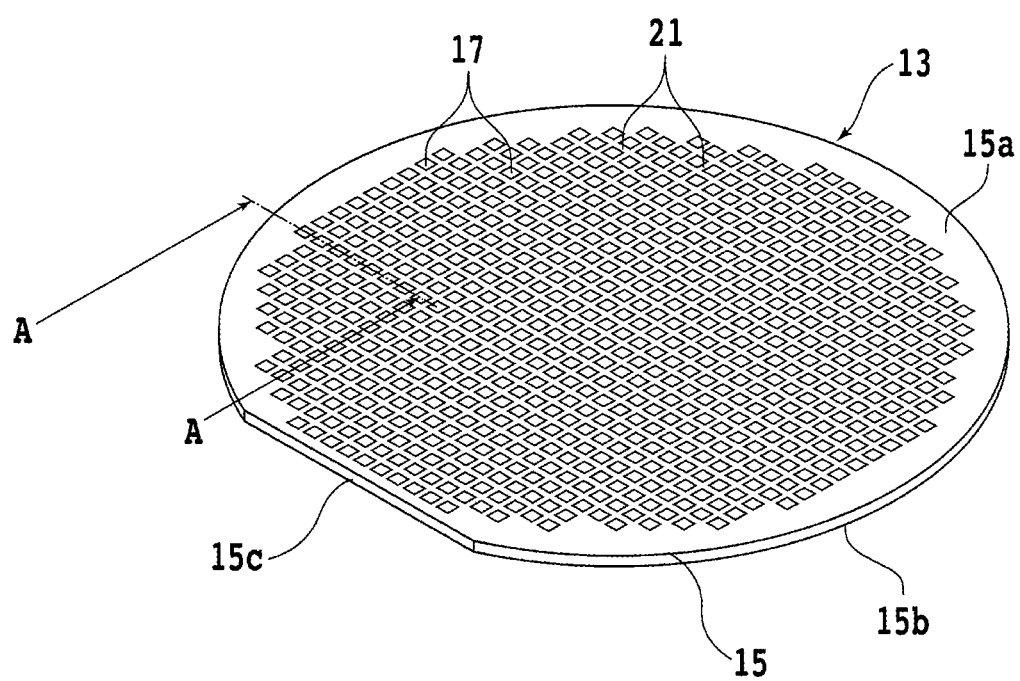
FIG. 3A is a perspective view of a red LED wafer.
Figure 3B:
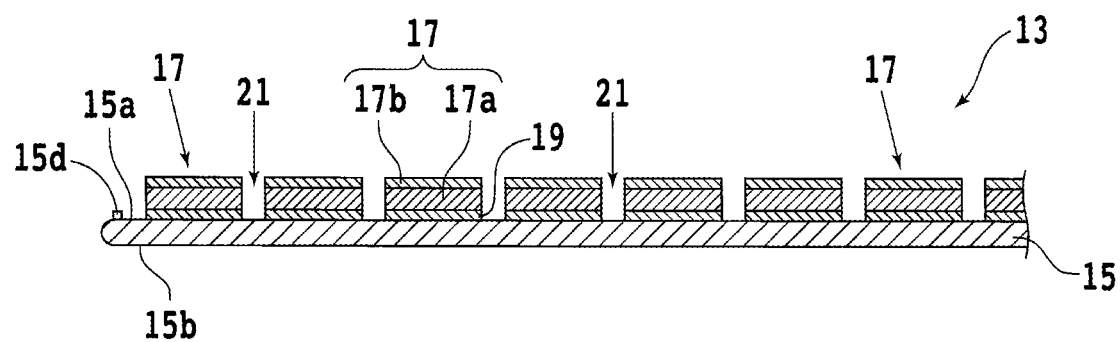
FIG. 3B is a cross-sectional view taken along line A-A of FIG. 3A.

The laser beam $L_B$ is not of a continuous wave but of a pulsed wave, and is used for laser lift off (LLO) (see FIG. 8B) in a buffer layer breaking step S50 to be described later. The red LED wafer 13 will be described below with reference to FIGS. 3A and 3B. FIG. 3A illustrates the red LED wafer 13 in perspective, and FIG. 3B illustrates the red LED wafer 13 in cross section taken along line A-A of FIG. 3A. As illustrated in FIGS. 3A and 3B, the monocrystalline substrate 15 of the red LED wafer 13 is shaped as a substantially circular plate made of sapphire or SiC.

The monocrystalline substrate 15 has a face side 15a on which there is formed a buffer layer 19 made of a gallium (Ga) compound such as gallium nitride (GaN). An epitaxial growth layer 17a is formed on the buffer layer 19. The buffer layer 19 has a function to relax a lattice mismatch between the monocrystalline substrate 15 and the epitaxial growth layer 17a. The epitaxial growth layer 17a is made of a compound semiconductor and includes an N-type semiconductor layer, a light-emitting layer, and a P-type semiconductor layer that are successively formed on the face side 15a with the buffer layer 19 interposed therebetween. The light-emitting layer has Eu-contained GaN, for example, but is not limited to such a material. The light-emitting layer may be made of other suitable materials.

An anode electrode layer 17b is provided on a surface of the epitaxial growth layer 17a opposite the buffer layer 19 and is held in contact with the P-type semiconductor layer. A cathode electrode layer, not illustrated, that is held in contact with the N-type semiconductor layer is provided on the side of the anode electrode layer 17b away from the viewer of FIG. 3B. The buffer layer 19, the epitaxial growth layer 17a, the anode electrode layer 17b, and the cathode electrode layer are severed into a plurality of areas along a plurality of element separating lines 21 established in a grid pattern on the face side 15a. The buffer layer 19, the epitaxial growth layer 17a, the anode electrode layer 17b, and the cathode electrode layer are severed along the element separating lines 21 by dry etching using a reactive gas, for example. The severed areas thus demarcated by the element separating lines 21 include respective red LEDs 17 each having the anode electrode layer 17b and the cathode electrode layer. Each of the red LEDs 17 emits red light when a forward voltage is applied thereto.

The monocrystalline substrate 15 has a reverse side 15b opposite to the face side 15a, the reverse side 15b corresponding to a reverse side of the red LED wafer 13. As illustrated in FIG. 3A, the monocrystalline substrate 15 has an orientation flat 15c formed on an outer circumferential edge thereof as indicating the crystal orientation of the monocrystalline substrate 15. As illustrated in FIG. 3B, a plurality of alignment marks 15d made of metal are disposed on an outer circumferential portion of the face side 15a. The alignment marks 15d are used in positioning the red LED wafer 13 with respect to the circuit board 11.

Figure 4A:
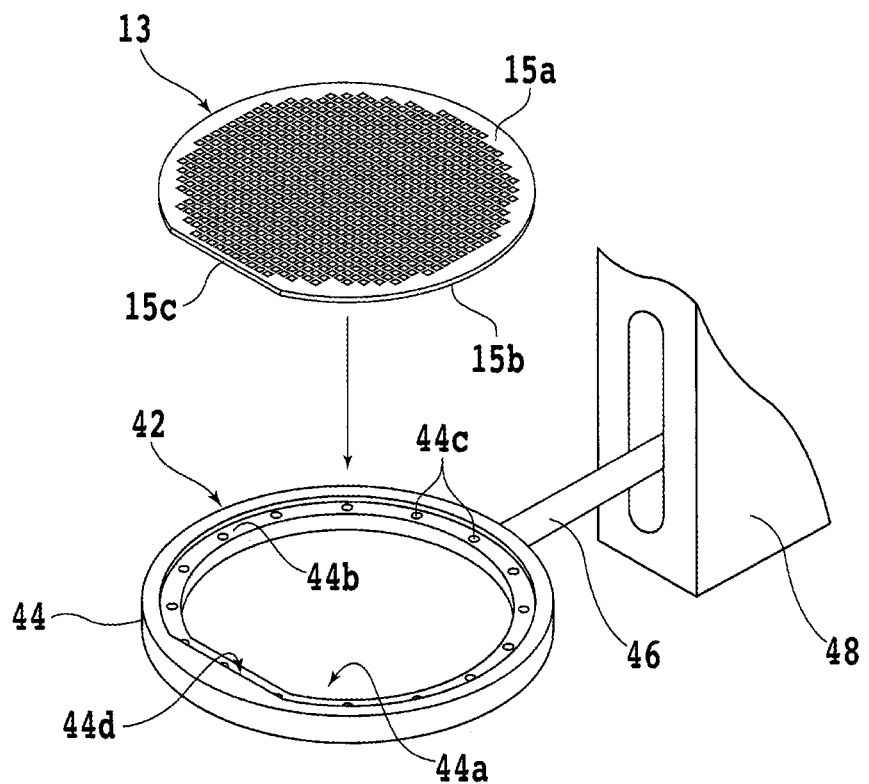
FIG. 4A is a view illustrating an LED wafer holding step.
Figure 4B:
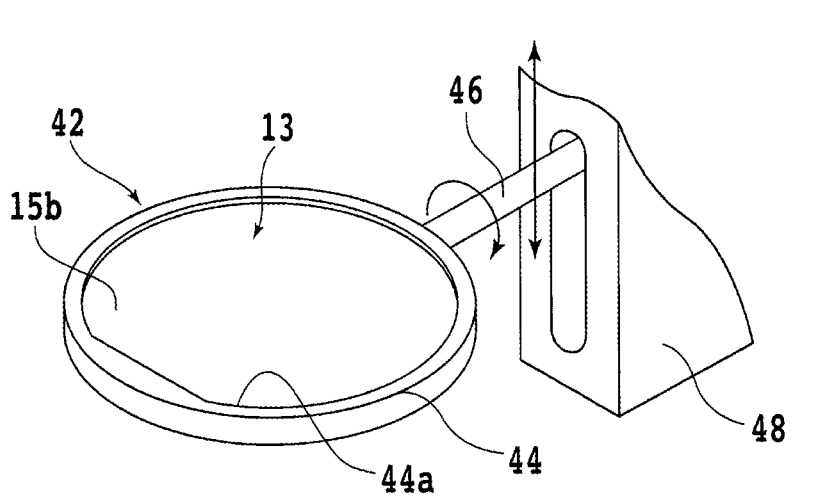
FIG. 4B is a view illustrating the manner in which a holding ring is inverted and moved.

A wafer holding unit 42 for holding the red LED wafer 13 under suction thereon will be described below with reference to FIGS. 4A and 4B. The wafer holding unit, i.e., a first holding unit, 42 is disposed below the beam condenser 38. The wafer holding unit 42 has a circular holding ring 44 having an opening 44a defined therein by an edge portion having a step 44b.

The step 44b has a plurality of suction ports 44c defined in an upper surface thereof at predetermined spaced intervals therealong. The suction ports 44c are connected to a suction source, not illustrated, such as an ejector through a predetermined fluid channel, not illustrated. The holding ring 44 has a positioning region 44d in the opening 44a to position the red LED wafer 13 in a predetermined orientation. The positioning region 44d is a straight region corresponding to the orientation flat 15c of the red LED wafer 13.

An arm 46 has an end coupled to the holding ring 44. The other end of the arm 46 is housed in a housing 48. The housing 48 also houses therein a rotating mechanism, not illustrated, for rotating the arm 46 about a predetermined rotational axis substantially parallel to the X-Y plane. The housing 48 further houses therein a moving mechanism, not illustrated, for moving the arm 46 along the Z-axis. FIG. 4B illustrates the manner in which the holding ring 44 is inverted and moved. Still other components of the laser processing apparatus 2 will be described below with reference to FIG. 1.

A first camera unit, not illustrated, for use in the alignment, i.e., positional detection, of the red LED wafer 13 held under suction by the wafer holding unit 42 is disposed near the beam condenser 38 above the wafer holding unit 42. The first camera unit has an optical system and an image capturing element. An image capturing unit 50 is mounted on the lower surface of the distal end portion of the beam 36 and spaced from the wafer holding unit 42 along the X-axis. The image capturing unit 50 is a second camera unit having an optical system and an image capturing element. The image capturing unit 50 captures an image of the circuit board 11 held under suction on the board holding frame 32. The captured image is used in the alignment, i.e., positional detection, of the circuit board 11 with respect to the red LED wafer 13.

The laser processing apparatus 2 has a control unit 52 for controlling operation of the components thereof. The control unit 52 is a computer including a processor, i.e., a processing device, typically a central processing unit (CPU), a main storage device such as a dynamic random access memory (DRAM), and an auxiliary storage device such as a flash memory. The auxiliary storage device stores software including predetermined programs. The control unit 52 has its functions performed by operating the processing device, etc., according to the software stored in the auxiliary storage device.

Figure 2:
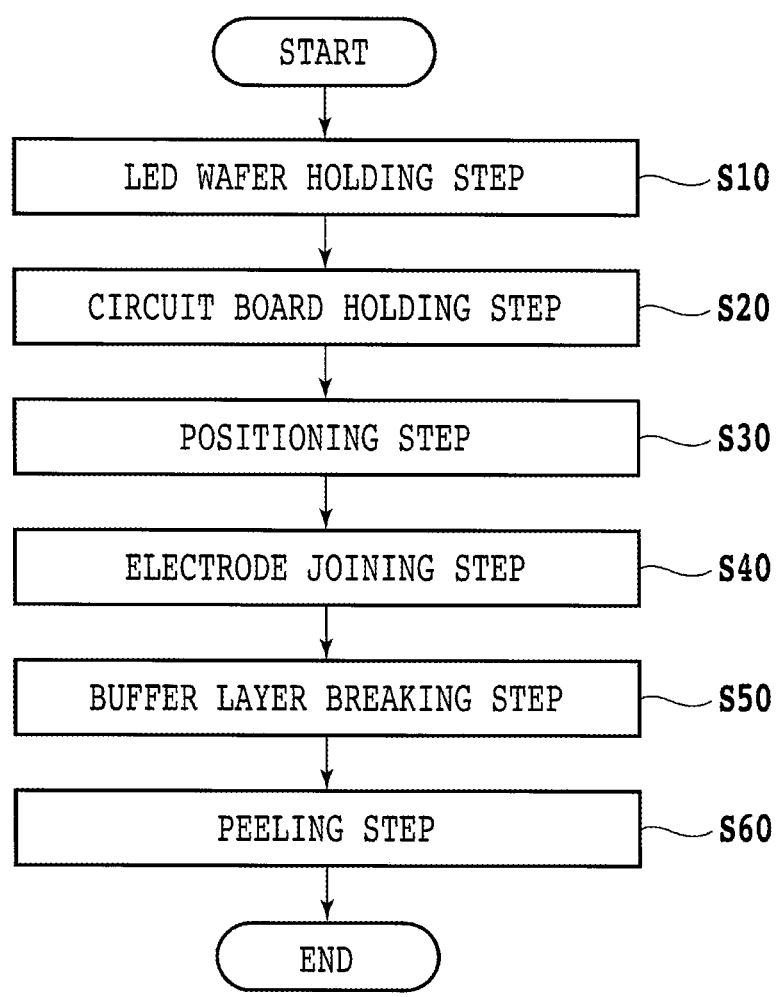
FIG. 2 is a flowchart of a method of manufacturing an LED display panel according to a first embodiment of the present invention.

The method of manufacturing the LED display panel 27 (see FIG. 11) according to the first embodiment will be described below with reference to FIGS. 2 through 11. The LED display panel 27 is manufactured by providing a plurality of LEDs in a predetermined layout on the circuit board 11. FIG. 2 is a flowchart of the method of manufacturing the LED display panel 27 according to the first embodiment. According to the present embodiment, a wafer delivery unit, not illustrated, places the red LED wafer 13 on the step 44b, which faces upwardly, of the wafer holding unit 42. At this time, the reverse side 15b of the monocrystalline substrate 15 has its outer circumferential portion held against the step 44b, and the positioning region 44d uniquely determines the orientation of the red LED wafer 13 with respect to the wafer holding unit 42 by engaging the orientation flat 15c of the monocrystalline substrate 15.

Then, a negative pressure from the suction source is transmitted to the suction ports 44c to enable the wafer holding unit 42 to hold the red LED wafer 13 under suction (LED wafer holding step S10). FIG. 4A illustrates the LED wafer holding step S10. After the LED wafer holding step S10, a board delivery unit, not illustrated, is used to place the circuit board 11 on the steps 32b of the board holding frame 32. At this time, the reverse side 11b of the circuit board 11 has outer peripheral portions held against the steps 32b. Then, a negative pressure from the suction source is transmitted to the suction ports 32c to enable the board holding frame 32 to hold the circuit board 11 under suction (circuit board holding step S20).

FIG. 5 illustrates the circuit board holding step S20 in perspective. Note that the order of the LED wafer holding step S10 and the circuit board holding step S20 is not limited to the above example. The LED wafer holding step S10 may be carried out after the circuit board holding step S20. After the LED wafer holding step S10 and the circuit board holding step S20, the image capturing unit 50 captures an image of the alignment mark 11d (FIG. 7A) of the circuit board 11, and the circuit board 11 is aligned by using the captured image. Thereafter, the X-axis moving unit 14 is actuated to position the circuit board 11 directly below the beam condenser 38, and the Y-axis moving unit 24 and the rotary actuator, not illustrated, are actuated to adjust the position and orientation of the circuit board 11 with respect to the beam condenser 38.

Figure 6:
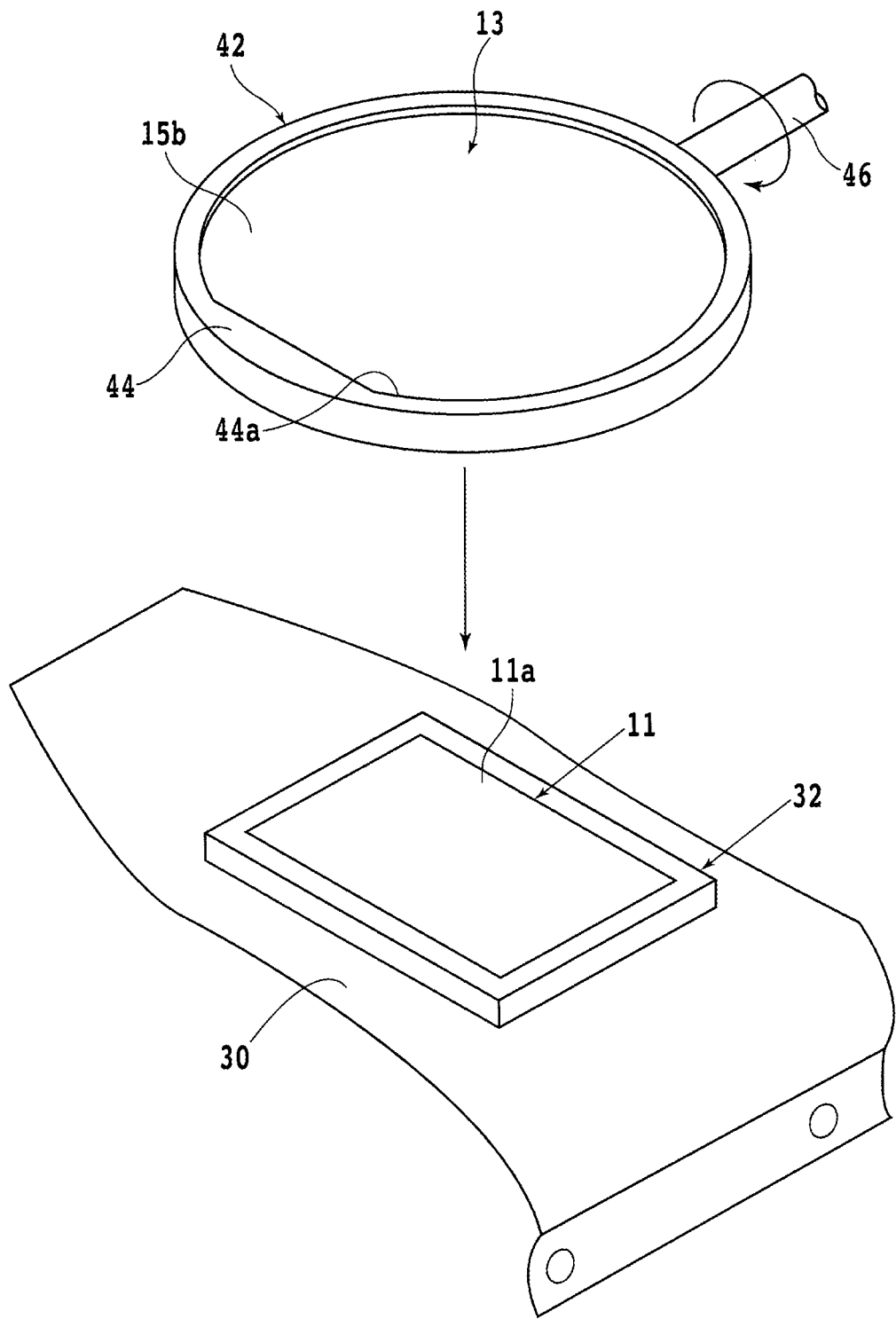
FIG. 6 is a perspective view illustrating a positioning step.

Then, as illustrated in FIG. 6, the wafer holding unit 42 that is holding the red LED wafer 13 under suction is inverted, i.e., turned upside down, to cause the face side 11a of the circuit board 11 and the face side 15a of the monocrystalline substrate 15 of the red LED wafer 13 to face each other. Thereafter, the first camera unit, not illustrated, captures an image of the alignment marks 15d through the monocrystalline substrate 15, and the red LED wafer 13 is aligned with respect to the circuit board 11 by using the captured image.

According to the present embodiment, since images of the circuit board 11 and the red LED wafer 13 are independently captured by the respective camera units, the depths of field of the first camera unit and the second camera unit, i.e., the image capturing unit 50, may be relatively small compared with the case where respective images of the circuit board 11 and the red LED wafer 13 are simultaneously captured. After the alignment, the rotary actuator is actuated to adjust the relative positions and orientations of the circuit board 11 and the red LED wafer 13, thereby bringing the electrodes $11c_1$ into positions aligned with the anode electrode layer 17b and bringing the electrodes $11c_2$ into positions aligned with the cathode electrode layer, not illustrated.

Figure 7A:
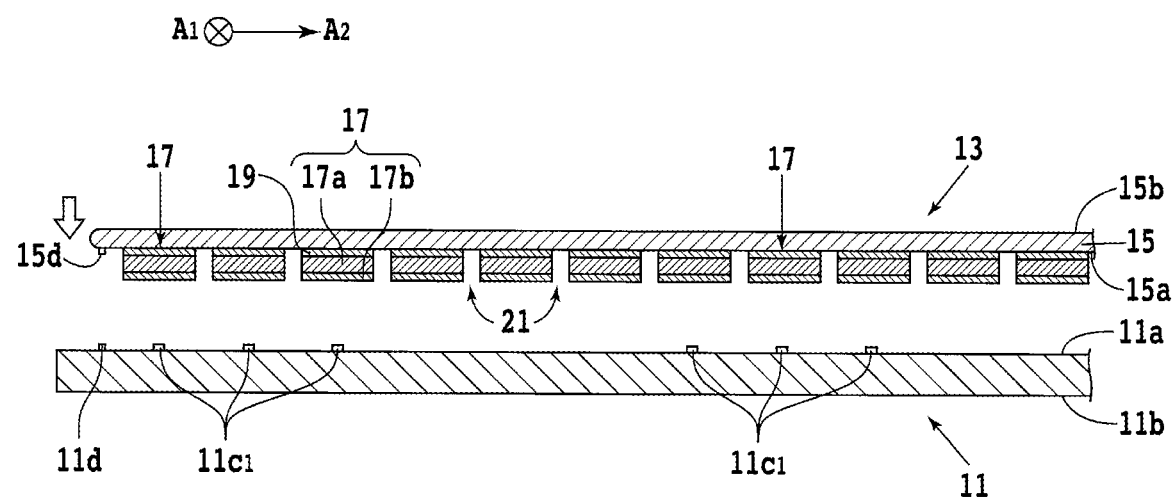
FIG. 7A is a fragmentary cross-sectional view of the red LED wafer and a circuit board in the positioning step.
Figure 7B:
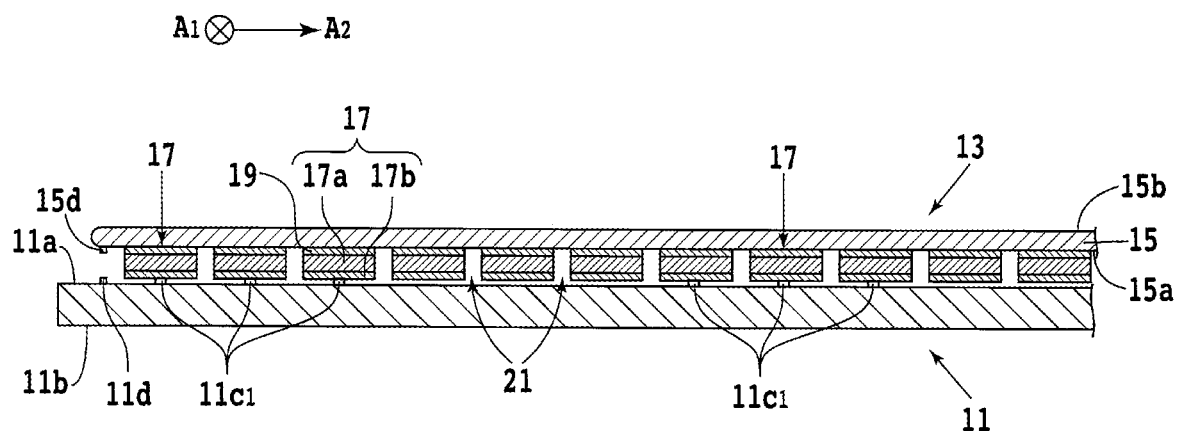
FIG. 7B is a fragmentary cross-sectional view of the red LED wafer and the circuit board after the positioning step.

Then, the red LED wafer 13 is lowered until the electrodes $11c_1$ contact the respective anode electrode layers 17b and the electrodes $11c_2$ contact the respective cathode electrode layers, not illustrated (positioning step S30). FIG. 6 illustrates the positioning step S30 in perspective. FIG. 7A illustrates the red LED wafer 13 and the circuit board 11 in the positioning step S30 in fragmentary cross section, and FIG. 7B illustrates the red LED wafer 13 and the circuit board 11 after the positioning step S30 in fragmentary cross section.

Figure 8A:
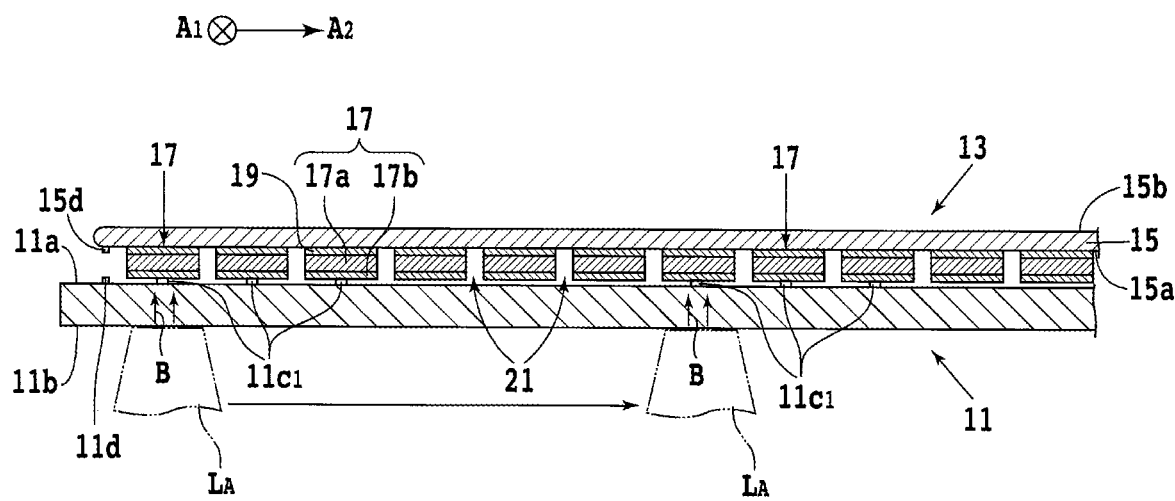
FIG. 8A is a fragmentary cross-sectional view illustrating an electrode joining step.

After the positioning step S30, the laser beam $L_A$ is applied to the reverse side 11b of the circuit board 11 to selectively heat the electrodes $11c_1$ and $11c_2$ (see FIG. 8A). In this manner, each of the electrodes $11c_1$ and a corresponding one of the anode electrode layers 17b are electrically joined to each other, and each of the electrodes $11c_2$ and a corresponding one of the cathode electrode layers are electrically joined to each other (electrode joining step S40). FIG. 8A illustrates the electrode joining step S40 in fragmentary cross section. In the electrode joining step S40, the laser beam $L_A$ that is used has a relatively low power density whose value is in the range of 100 W/cm² to 300 W/cm². The electrodes $11c_1$ and $11c_2$ are selectively heated by the heat B of absorption that is locally generated in the circuit board 11 by the laser beam $L_A$ in an area where the laser beam $L_A$ is applied to the circuit board 11.

Specifically, the laser beam $L_A$ is applied to a local area of the circuit board 11 corresponding to an electrode $11c_1$ positioned on the leftmost side in FIG. 8A, thereby melting the electrode $11c_1$. The melted electrode $11c_1$ is then solidified and hence electrically joined to a corresponding one of the anode electrode layers 17b. Then, the galvanoscanner changes the position where the laser beam $L_A$ is applied, i.e., applies the laser beam $L_A$ to a local area of the circuit board 11 corresponding to an electrode $11c_2$ that is positioned in a direction, i.e., a row direction $A_1$, away from the viewer of FIG. 8A, thereby electrically joining the electrode $11c_2$ to a corresponding one of the cathode electrode layers. Similarly, the position where the laser beam $L_A$ is applied is successively changed along the row direction $A_1$, thereby electrically joining successive electrodes $11c_1$ to corresponding ones of the anode electrode layers 17b and successive electrodes $11c_2$ to corresponding ones of the cathode electrode layers.

Then, the position where the laser beam $L_A$ is applied is changed to the right in FIG. 8A, i.e., in a column direction $A_2$, and the laser beam $L_A$ is applied to a local area of the circuit board 11 corresponding to the seventh electrode $11c_1$ from the leftmost side in FIG. 8A, thereby electrically joining the electrode $11c_1$ to a corresponding one of the anode electrode layers 17b. Similarly, the position where the laser beam $L_A$ is applied is successively changed along the row direction $A_1$, thereby electrically joining successive electrodes $11c_1$ to corresponding ones of the anode electrode layers 17b and successive electrodes $11c_2$ to corresponding ones of the cathode electrode layers. Subsequently, the laser beam $L_A$ is similarly applied to red LEDs 17 that are spaced from one another by a distance covering five red LEDs 17 in the column direction $A_2$. In other words, the laser beam $L_A$ is applied to the first, seventh, thirteenth, nineteenth, twenty-fifth, . . . red LEDs 17 from the leftmost side in FIG. 8A.

An example of processing conditions in the electrode joining step S40 is set forth below. Note that the irradiation time refers to an irradiation time required to individually heat each of the electrodes $11c_1$ and $11c_2$. A total time calculated as the product of the number of the electrodes $11c_1$ and $11c_2$ and the irradiation time is required to complete the electrode joining step S40.

Laser oscillator: YAG continuous oscillation laser
Wavelength: in the range of 400 nm to 1100 nm, e.g., 980 nm
Power density: in the range of 100 W/cm² to 300 W/cm², e.g., 100 W/cm²
Irradiation area: a diameter in the range of 1 mm² to 1 cm²
Irradiation time: approximately 1 s In the electrode joining step S40 according to the present embodiment, the laser beam $L_A$ that has a wavelength absorbable by the circuit board 11 is used in order to electrically connect the red LEDs 17 and the electrodes $11c_1$ and $11c_2$ to each other. Therefore, as metal interconnects, etc., having a high rate of absorption of laser beam $L_A$ can be placed on the circuit board 11, the degree of freedom in designing the circuit board 11 is increased compared with a case where the electrode joining step S40 is carried out with a laser beam having a wavelength transmittable through the circuit board 11.

Figure 8B:
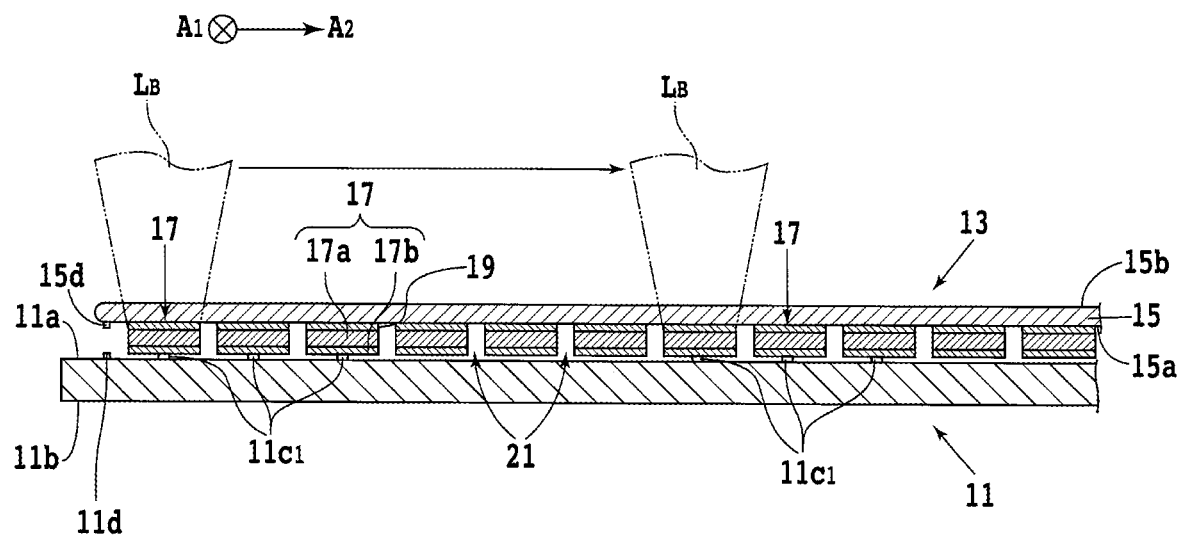
FIG. 8B is a fragmentary cross-sectional view illustrating a buffer breaking step.

After the electrode joining step S40, a pulsed laser beam $L_B$ (see FIG. 8B) having a wavelength transmittable through the monocrystalline substrate 15 is applied to the buffer layer 19 of the red LED wafer 13 through the reverse side 15b, thereby breaking the buffer layer 19 (buffer layer breaking step S50). FIG. 8B illustrates the buffer layer breaking step S50 in fragmentary cross section. An example of processing conditions in the buffer layer breaking step S50 is set forth below.

Laser oscillator: YAG pulsed oscillation laser
Wavelength: 257 nm
Repetitive frequency: 50 kHz
Average output power: 0.12 W
Pulse duration: 100 ns
Spot diameter: 10 μm Processing feed speed: 600 mm/s Specifically, while the galvanoscanner changes the position where the laser beam $L_B$ is applied along the row direction $A_1$, the laser beam $L_B$ is applied to the buffer layers 19 corresponding to a plurality of red LEDs 17 positioned on the leftmost side in FIG. 8B, thereby breaking the buffer layers 19. Then, the position where the laser beam $L_B$ is applied is moved to the right in FIG. 8B, i.e., in the column direction $A_2$, and changed to the buffer layers 19 illustrated as the seventh buffer layers 19 from the leftmost side in FIG. 8B. The laser beam $L_B$ is applied to successively break the buffer layers 19 while the galvanoscanner changes the position where the laser beam $L_B$ is applied along the row direction $A_1$. Subsequently, the laser beam $L_B$ is similarly applied to red LEDs 17 that are spaced from one another by a distance covering five red LEDs 17 in the column direction $A_2$. In this manner, the bonding force between the monocrystalline substrate 15 and the red LEDs 17 joined to the electrodes $11c_1$ and $11c_2$ in the electrode joining step S40 is essentially eliminated.

Figure 9:
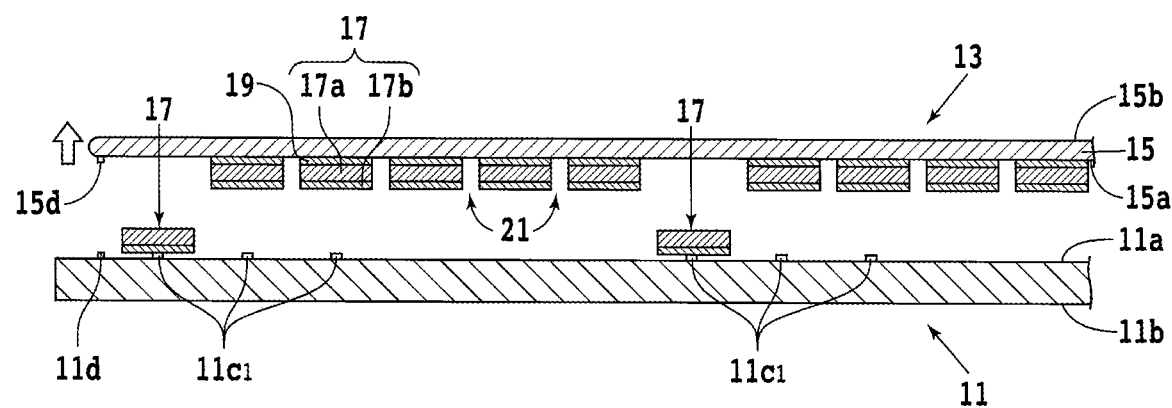
FIG. 9 is a fragmentary cross-sectional view illustrating a peeling step.
Figure 10:
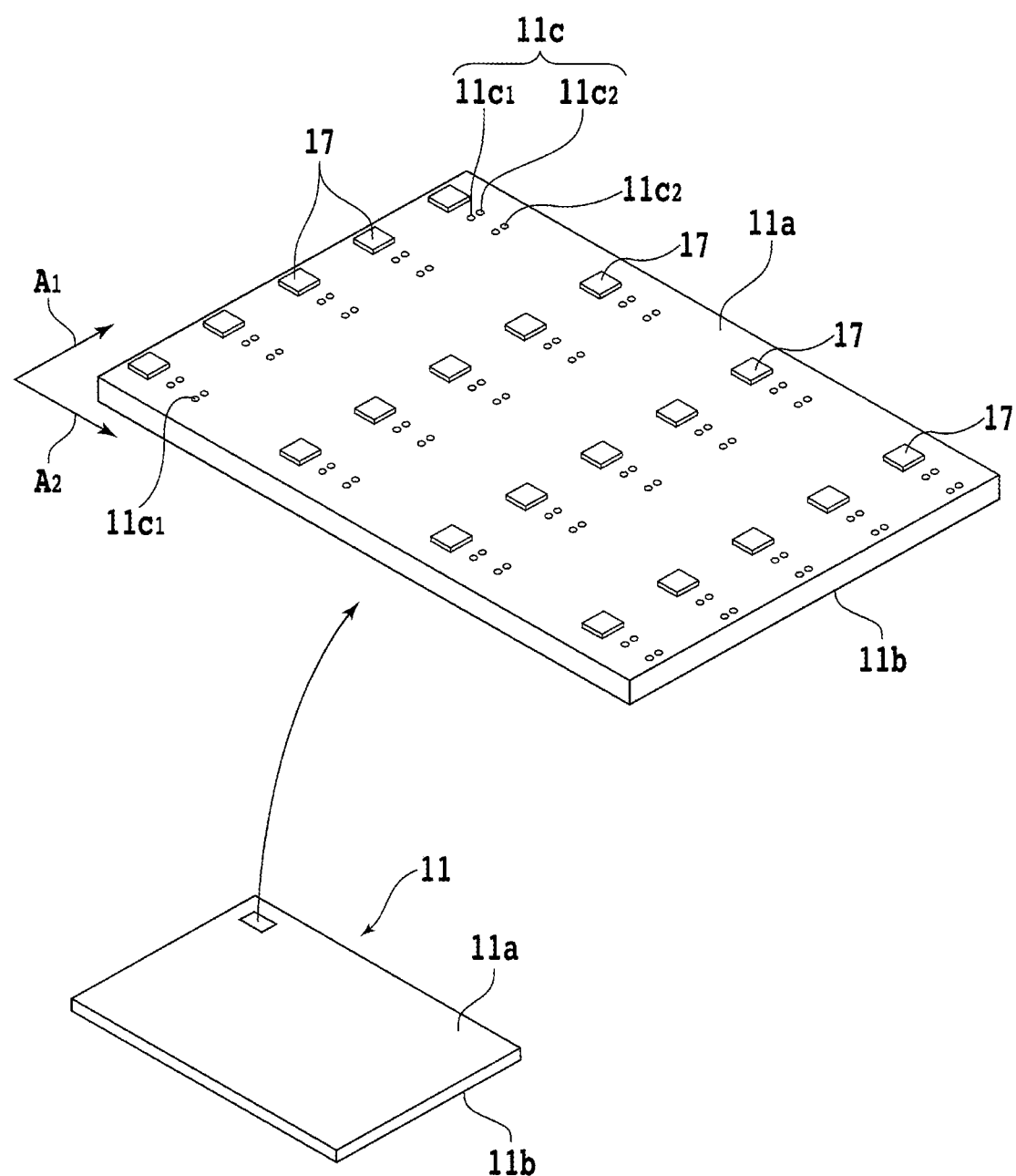
FIG. 10 is a perspective view of a plurality of red LEDs secured to the circuit board.

After the buffer layer breaking step S50, the arm 46 is lifted to peel off the monocrystalline substrate 15 from the red LEDs 17 (peeling step S60). FIG. 9 illustrates the peeling step S60 in fragmentary cross section. FIG. 10 illustrates a plurality of red LEDs 17 secured to the circuit board 11 after the peeling step S60. After a plurality of red LEDs 17 have been mounted on the circuit board 11, a plurality of green LEDs 23 (see FIG. 11) for emitting green light are mounted on the circuit board 11 by using a green LED wafer, not illustrated, that has the plurality of green LEDs 23.

The green LED wafer, not illustrated, has a monocrystalline substrate that is shaped as a substantially circular plate. An epitaxial growth layer is formed on a face side of the monocrystalline substrate with a buffer layer interposed therebetween. The epitaxial growth layer is made of a compound semiconductor and includes an N-type semiconductor layer, a light-emitting layer, and a P-type semiconductor layer. The light-emitting layer is made of indium gallium nitride (InGaN), for example, but is not limited to such a material. The light-emitting layer may be made of other suitable materials.

An anode electrode layer is provided on the epitaxial growth layer and held in contact with the P-type semiconductor layer. A cathode electrode layer is provided on the epitaxial growth layer and held in contact with the N-type semiconductor layer. The buffer layer, the epitaxial growth layer, the anode electrode layer, and the cathode electrode layer are severed into a plurality of areas along a plurality of element separating lines established in a grid pattern on the face side of the monocrystalline substrate. The severed areas thus demarcated by the element separating lines include respective green LEDs 23. The green LEDs 23 are secured to the circuit board 11 in successive steps including the LED wafer holding step S10 through the peeling step S60, as described above.

After a plurality of green LEDs 23 have been mounted on the circuit board 11, a plurality of blue LEDs 25 (see FIG. 11) for emitting blue light are mounted on the circuit board 11 by using a blue LED wafer, not illustrated, that has the plurality of blue LEDs 25.

The blue LED wafer, not illustrated, has a monocrystalline substrate that is shaped as a substantially circular plate. An epitaxial growth layer is formed on a face side of the monocrystalline substrate with a buffer layer interposed therebetween. The epitaxial growth layer is made of a compound semiconductor and includes an N-type semiconductor layer, a light-emitting layer, and a P-type semiconductor layer. The light-emitting layer is made of InGaN where the composition ratio of In (i.e., Indium) is smaller than that of the light-emitting layer for emitting green light, for example, but is not limited to such a material. The light-emitting layer may be made of other suitable materials.

Figure 11:
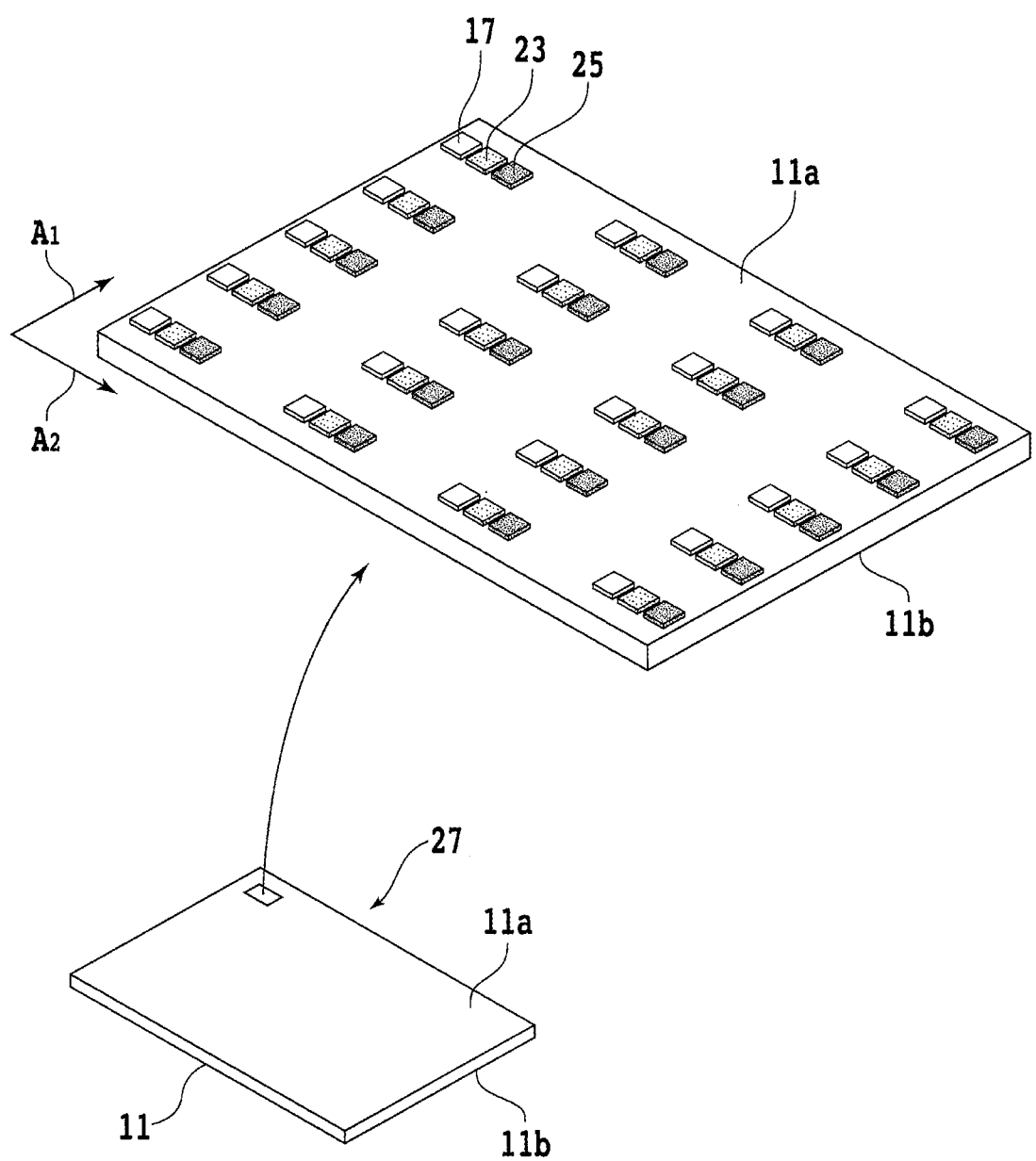
FIG. 11 is a perspective view of a plurality of red LEDs, a plurality of green LEDs, and a plurality of blue LEDs that are secured to the circuit board.

An anode electrode layer is provided on the epitaxial growth layer and held in contact with the P-type semiconductor layer. A cathode electrode layer is provided on the epitaxial growth layer and held in contact with the N-type semiconductor layer. The buffer layer, the epitaxial growth layer, the anode electrode layer, and the cathode electrode layer are severed into a plurality of areas along a plurality of element separating lines established in a grid pattern on the face side of the monocrystalline substrate. The severed areas thus demarcated by the element separating lines include respective blue LEDs 25. The blue LEDs 25 are secured to the circuit board 11 in successive steps including the LED wafer holding step S10 through the peeling step S60, as described above. FIG. 11 illustrates, in perspective, the red LEDs 17, the green LEDs 23, and the blue LEDs 25 that are secured to the circuit board 11. The LED display panel 27 is manufactured in the manner described above. The order of the electrode joining step S40 and the buffer layer breaking step S50 is not limited to the above example. The electrode joining step S40 may be carried out after the buffer layer breaking step S50.

According to the present embodiment, the electrode joining step S40 is carried out by using the laser beam $L_A$ whose wavelength is absorbable by the circuit board 11. Therefore, the degree of freedom in designing the circuit board 11 is increased compared with the case where the electrode joining step S40 is carried out with a laser beam having a wavelength transmittable through the circuit board 11.

Second Embodiment

Next, a second embodiment of the present invention will be described below. Note that those details of the second embodiment that are identical to those of the first embodiment will basically be omitted from description. According to the second embodiment, the electrodes $11c_1$ and $11c_2$, the anode electrode layers 17b, and the cathode electrode layers are not held in contact with one another, and are spaced from one another by a distance C (see FIG. 12A). The distance C occurs due to a warpage of the red LED wafer 13, for example. The distance C is of a predetermined value in the range of approximately 10 μm to 20 μm, for example. In a method of manufacturing the LED display panel 27 according to the second embodiment, the LED wafer holding step S10, the circuit board holding step S20, and the positioning step S30 are carried out by using the red LED wafer 13 and the circuit board 11.

Figure 12A:
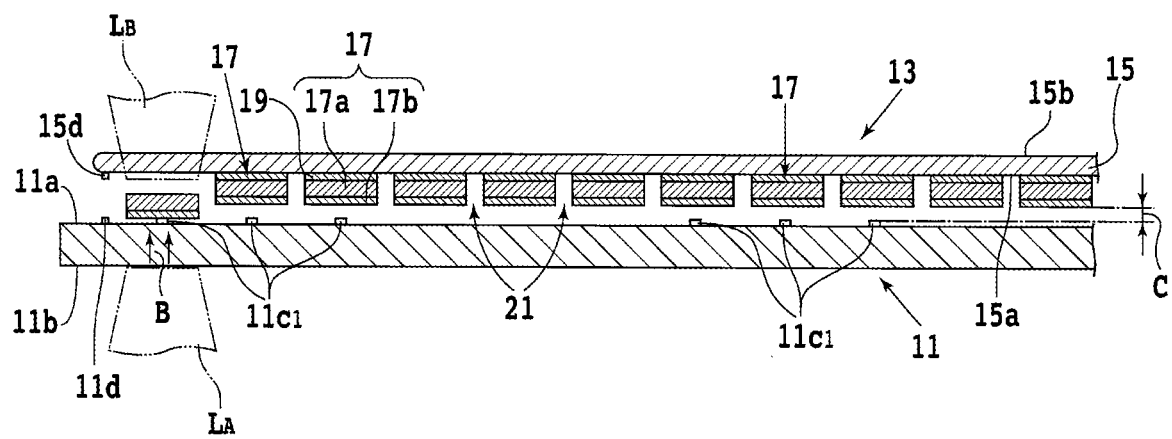
FIG. 12A is a fragmentary cross-sectional view illustrating a first step in an electrode joining step and a buffer layer breaking step according to a second embodiment of the present invention.

According to the second embodiment, after the positioning step S30, the buffer layer breaking step S50 is carried out while the electrode joining step S40 is performed. FIG. 12A illustrates, in fragmentary cross section, a first step in the electrode joining step S40 and the buffer layer breaking step S50 according to the second embodiment. Specifically, while a local area corresponding to one electrode $11c_1$ positioned on the leftmost side in FIG. 12A is heated by the laser beam $L_A$, the buffer layer 19 positioned thereabove is broken by the laser beam $L_B$. The red LED 17 is now released downwardly, allowing the anode electrode layer 17b thereof to be joined to the electrode $11c_1$ that is heated.

Thereafter, while a local area corresponding to one electrode $11c_2$ positioned on the leftmost side in FIG. 12A is heated by the laser beam $L_A$, the buffer layer 19 positioned thereabove is broken by the laser beam $L_B$, allowing the cathode electrode layer of the red LED 17 to be joined to the electrode $11c_2$. Then, the galvanoscanner changes the position where the laser beam is applied along the row direction $A_1$, thereby electrically joining successive electrodes $11c_1$ to corresponding ones of the anode electrode layers 17b of the red LEDs 17 and successive electrodes $11c_2$ to corresponding ones of the cathode electrode layers of the red LEDs 17.

Figure 12B:
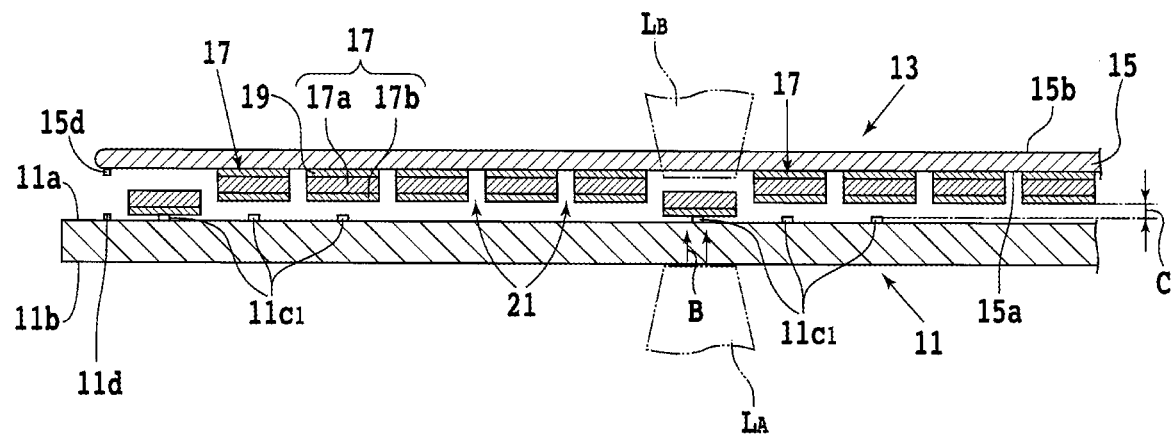
FIG. 12B is a fragmentary cross-sectional view illustrating a second step in the electrode joining step and the buffer layer breaking step according to the second embodiment.

Then, the position where the laser beam $L_A$ is applied is changed to the area of the reverse side 11b corresponding to the seventh electrode $11c_1$ from the leftmost side in FIG. 12B. FIG. 12B illustrates, in fragmentary cross section, a second step in the electrode joining step S40 and the buffer layer breaking step S50 according to the second embodiment. Specifically, while a local area corresponding to one electrode $11c_1$ is heated by the laser beam $L_A$, the buffer layer 19 is broken by the laser beam $L_B$, allowing the anode electrode layer 17b to be joined to the electrode $11c_1$ that is heated.

In this manner, at red LEDs 17 that are spaced from one another by a distance covering five red LEDs 17 along the column direction $A_2$, an anode electrode layer 17b is electrically joined to one electrode $11c_1$, and a cathode electrode layer is electrically joined to one electrode $11c_2$. Thereafter, the peeling step S60 is carried out, separating the red LED wafer 13 from the circuit board 11. Then, green LEDs 23 and blue LEDs 25 are similarly joined to the circuit board 11 from the green LED wafer and the blue LED wafer.

According to the second embodiment, the electrode joining step S40 is also carried out by using the laser beam $L_A$ whose wavelength is absorbable by the circuit board 11. Therefore, the degree of freedom in designing the circuit board 11 is increased compared with the case where the electrode joining step S40 is carried out with a laser beam having a wavelength transmittable through the circuit board 11.

Third Embodiment

According to a third embodiment of the present invention, the electrode joining step S40 and the buffer layer breaking step S50 are alternately carried out on a plurality of red LEDs 17 arranged along the row direction $A_1$. According to the third embodiment, the LED wafer holding step S10 and the circuit board holding step S20 are carried out by using the red LED wafer 13 and the circuit board 11. Thereafter, the positioning step S30 is carried out.

In the positioning step S30, as with the first embodiment, the electrodes $11c_1$ and the anode electrode layers 17b are brought into contact with each other, and the electrodes $11c_2$ and the cathode electrode layers are brought into contact with each other. After the positioning step S30, the electrode joining step S40 and the buffer layer breaking step S50 are alternately carried out. For example, while the galvanoscanner changes the position where the laser beam $L_A$ is applied along the row direction $A_1$, the laser beam $L_A$ is applied to areas of the reverse side 11b that correspond to a plurality of pairs of electrodes $11c_1$ and $11c_2$ positioned on the leftmost side in FIG. 13A, thereby heating the pairs of electrodes $11c_1$ and $11c_2$ in the electrode joining step S40.

Figure 13A:
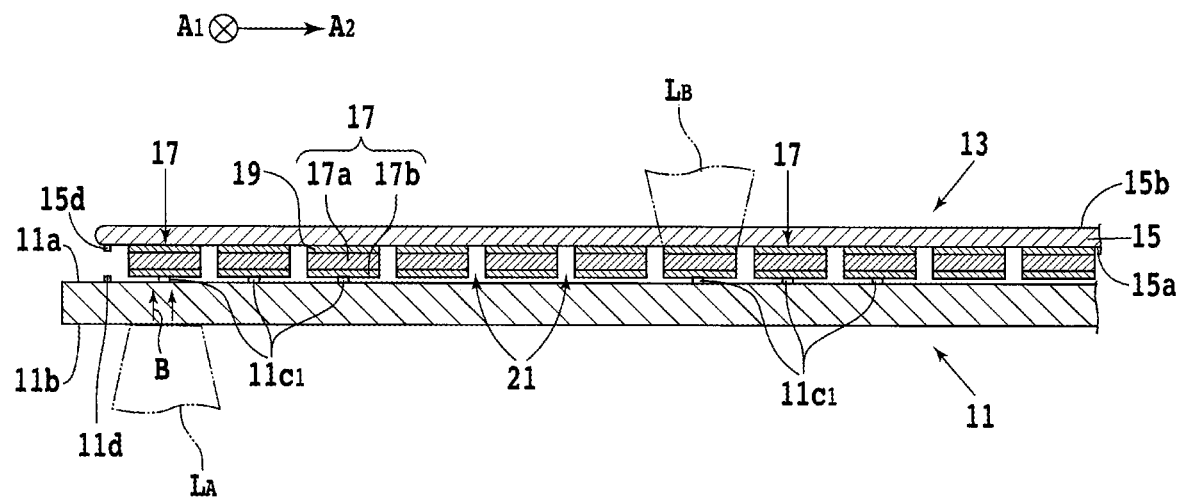
FIG. 13A is a fragmentary cross-sectional view illustrating a first step in an electrode joining step and a buffer layer breaking step according to a third embodiment of the present invention.
Figure 13B:
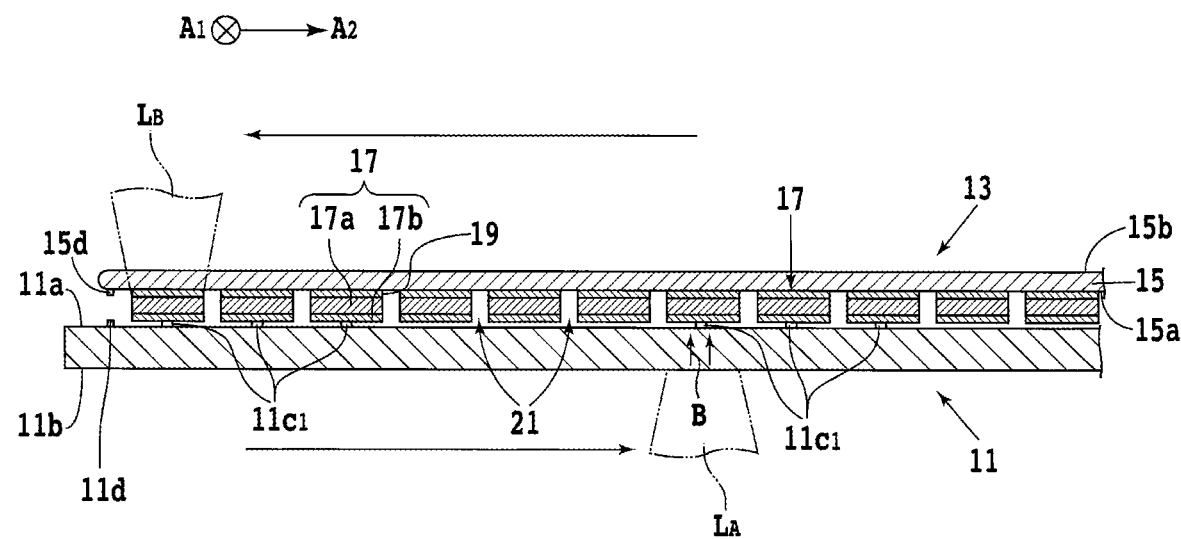
FIG. 13B is a fragmentary cross-sectional view illustrating a second step in the electrode joining step and the buffer layer breaking step according to the third embodiment.

At this time, while the galvanoscanner changes the position where the laser beam $L_B$ is applied along the row direction $A_1$, the laser beam $L_B$ is applied to the buffer layers 19 corresponding to a plurality of seventh red LEDs 17 from the leftmost side in FIG. 13A, thereby breaking the buffer layers 19 in the buffer layer breaking step S50. FIG. 13A illustrates, in fragmentary cross section, a first step in the electrode joining step S40 and the buffer layer breaking step S50 according to the third embodiment. FIG. 13B illustrates, in fragmentary cross section, a second step in the electrode joining step S40 and the buffer layer breaking step S50 according to the third embodiment.

In the second step, the laser beam $L_A$ is applied to the area of the reverse side 11b corresponding to a plurality of seventh pairs of electrodes $11c_1$ and $11c_2$ from the leftmost side in FIG. 13B while the galvanoscanner changes the position where the laser beam $L_A$ is applied along the row direction $A_1$, thereby heating the plurality of pairs of electrodes $11c_1$ and $11c_2$ in the electrode joining step S40. At this time, while the galvanoscanner changes the position where the laser beam $L_B$ is applied along the row direction $A_1$, the laser beam $L_B$ is applied to the buffer layers 19 corresponding to a plurality of red LEDs 17 positioned on the leftmost side in FIG. 13B, thereby breaking the buffer layers in the buffer layer breaking step S50.

In this manner, the electrode joining step S40 and the buffer layer breaking step S50 are alternately carried out to secure the red LEDs 17 to the circuit board 11 and to essentially eliminate the bonding force between the red LEDs 17 and the monocrystalline substrate 15, after which the peeling step S60 is carried out. According to the third embodiment, since the electrode joining step S40 is carried out by using the laser beam $L_A$ whose wavelength is absorbable by the circuit board 11, the degree of freedom in designing the circuit board 11 is increased compared with the case where the electrode joining step S40 is carried out with a laser beam having a wavelength transmittable through the circuit board 11. Further, as the electrode joining step S40 and the buffer layer breaking step S50 are simultaneously carried out, the period of time required to perform the steps is shortened.

Fourth Embodiment

According to a fourth embodiment of the present invention, both the laser beams $L_A$ and $L_B$ are applied to the reverse side 15b of the monocrystalline substrate 15. In a method of manufacturing the LED display panel 27 according to the fourth embodiment, the LED wafer holding step S10, the circuit board holding step S20, and the positioning step S30 are carried out by using the red LED wafer 13 and the circuit board 11. According to the fourth embodiment, in the laser processing apparatus 2, the laser beam applying unit 28 for applying the laser beam $L_A$ is not housed in the support post 26 but housed in the column 34 or the beam 36. The laser beam applying unit 28 has another beam condenser, not illustrated, that is disposed above the holding table 30 and that includes an fθ lens, not illustrated, as is the case with the beam condenser 38.

According to the fourth embodiment, the laser beams $L_A$ and $L_B$ are emitted respectively from the laser beam applying units 28 and 40 and applied respectively to different areas of the reverse side 15b of the red LED wafer 13. Inasmuch as the monocrystalline substrate 15 is made of sapphire or SiC, the wavelength of the laser beam $L_A$ is set to a predetermined value of 100 nm or less to allow the laser beam $L_A$ to be absorbed by the monocrystalline substrate 15.

Figure 14A:
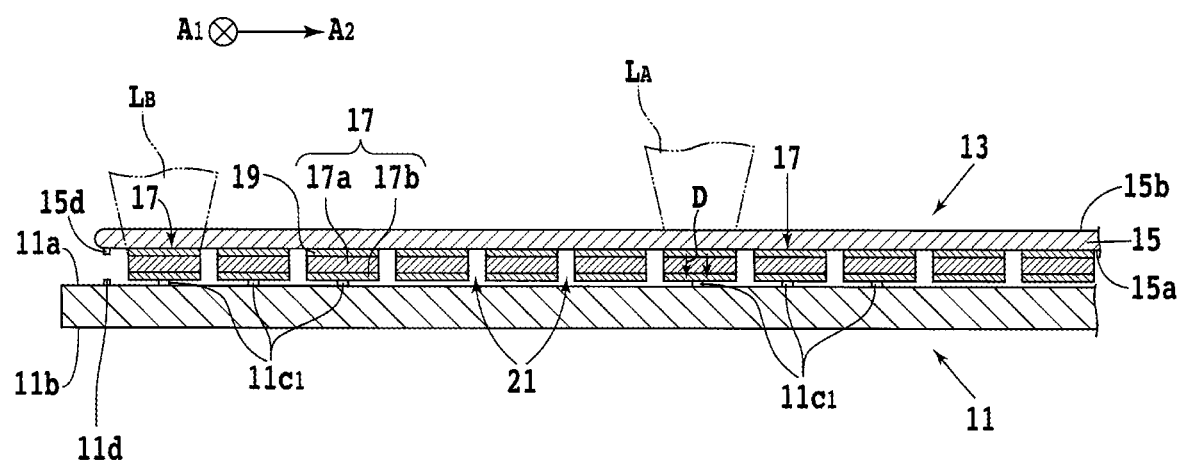
FIG. 14A is a fragmentary cross-sectional view illustrating a first step in an electrode joining step and a buffer layer breaking step according to a fourth embodiment of the present invention.

FIG. 14A illustrates, in fragmentary cross section, a first step in the electrode joining step S40 and the buffer layer breaking step S50 according to the fourth embodiment. In the first step, the laser beam $L_B$ is applied to the buffer layer 19 corresponding to the red LED 17 positioned on the leftmost side in FIG. 14A, thereby breaking the buffer layer 19. Similarly, while the galvanoscanner changes the position where the laser beam $L_B$ is applied along the row direction $A_1$, the laser beam $L_B$ is applied to the buffer layers 19 corresponding to a plurality of red LEDs 17 positioned on the leftmost side in FIG. 14A, thereby breaking the buffer layers 19.

After the laser beam $L_B$ has been applied, the laser beam $L_A$ is applied to one electrode $11c_1$ corresponding to the seventh red LED 17 from the leftmost side in FIG. 14A. The applied laser beam $L_A$ is absorbed by the reverse side 15b, and the heat D of absorption that is locally generated is transferred through the anode electrode layer 17b to the electrode $11c_1$. In the electrode joining step S40, the laser beam $L_A$ is applied while the galvanoscanner changes the position where the laser beam $L_A$ is applied along the row direction $A_1$, thereby heating the electrodes $11c_1$ and $11c_2$ corresponding to the seventh red LEDs 17 from the leftmost side in FIG. 14A and joining the electrodes $11c_1$ and $11c_2$ to the respective red LEDs 17.

Figure 14B:
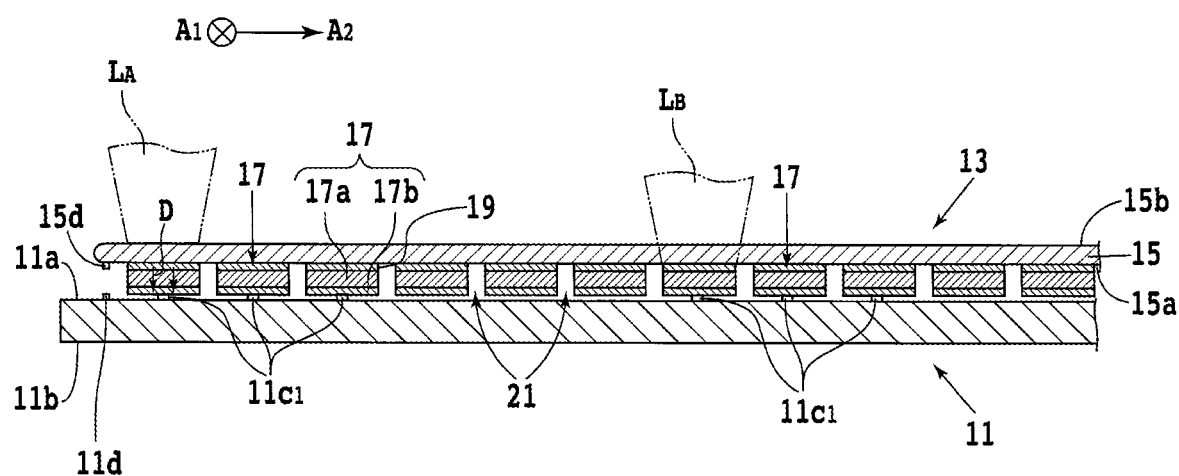
FIG. 14B is a fragmentary cross-sectional view illustrating a second step in the electrode joining step and the buffer layer breaking step according to the fourth embodiment.

Then, as illustrated in FIG. 14B, the laser beams $L_A$ and $L_B$ that are applied to the monocrystalline substrate 15 are positionally switched around. FIG. 14B illustrates, in fragmentary cross section, a second step in the electrode joining step S40 and the buffer layer breaking step S50 according to the fourth embodiment. The laser beam $L_A$ is applied to one electrode $11c_1$ corresponding to the red LED 17 positioned on the leftmost side in FIG. 14B, thereby joining the anode electrode layer 17b of the red LED 17 and the electrode $11c_1$ to each other. Moreover, the laser beam $L_A$ is applied while the galvanoscanner changes the position where the laser beam $L_A$ is applied along the row direction $A_1$, thereby heating the electrodes $11c_1$ and $11c_2$ corresponding to the red LEDs 17 positioned on the leftmost side in FIG. 14B and joining the electrodes $11c_1$ and $11c_2$ to the respective red LEDs 17.

Then, the buffer layer 19 corresponding to the seventh red LED 17 from the leftmost side in FIG. 14B is broken by the laser beam $L_B$. The laser beam $L_B$ is applied while the galvanoscanner changes the position where the laser beam $L_B$ is applied along the row direction $A_1$, thereby breaking the buffer layers 19. In this fashion, the electrode joining step S40 and the buffer layer breaking step S50 are alternately carried out to secure the red LEDs 17 to the circuit board 11 and to essentially eliminate the bonding force between the red LEDs 17 and the monocrystalline substrate 15, after which the peeling step S60 is carried out.

According to the fourth embodiment, the electrode joining step S40 is carried out by using the laser beam $L_A$ whose wavelength is absorbable by the monocrystalline substrate 15. Therefore, the degree of freedom in designing the circuit board 11 is increased compared with the case where the electrode joining step S40 is carried out with a laser beam having a wavelength transmittable through the circuit board 11. Further, as the electrode joining step S40 and the buffer layer breaking step S50 are simultaneously carried out, the period of time required to perform the steps is shortened.

Fifth Embodiment

According to a first embodiment of the present invention, the laser beam applying unit 28 further includes a spatial light modulator (SLM) 28d (see FIG. 15) disposed between the laser oscillator 28a and the Y scan mirror 28b. FIG. 15 illustrates, in perspective, the laser beam applying unit 28 according to the fifth embodiment. The spatial light modulator 28d according to the fifth embodiment is a transmissive LCOS-SLM having a liquid crystal on silicon (LCOS).

However, the spatial light modulator 28d may be a reflective LCOS-SLM. In addition, a predetermined optical system such as a relay lens may be disposed in the optical path between the laser oscillator 28a and the Y scan mirror 28b. The spatial light modulator 28d controls diffraction and interference of light to vary the power density distribution of the laser beam $L_A$ within an irradiation area that is irradiated by the laser beam $L_A$. The irradiation area that is irradiated by the laser beam $L_A$ is a circular area having a diameter in the range of 1 mm² to 1 cm² described above, for example.

The spatial light modulator 28d can vary the power density distribution of the laser beam $L_A$ such that the power density has a local peak positioned in an area corresponding to a plurality of electrodes $11c_1$, a plurality of electrodes $11c_2$, or one or more electrodes $11c_1$ and one or more electrodes $11c_2$. Further, the spatial light modulator 28d can establish a power density distribution for the laser beam $L_A$ such that the power density has a local peak positioned in a continuous area in an irradiation area that is irradiated by the laser beam $L_A$.

For example, the spatial light modulator 28d can establish a power density distribution for the laser beam $L_A$ such that the power density has a local peak positioned in a continuous area extending over a plurality of electrodes $11c_1$, a continuous area extending over a plurality of electrodes $11c_2$, or a continuous area extending over one or more electrodes $11c_1$ and one or more electrodes $11c_2$. As a local area can be heated at the position where the power density has a peak, the heating of the area can be performed appropriately taking into account the melting point of the material of the electrodes $11c_1$ and $11c_2$, the local differences between thermal conductivities of the circuit board 11 and the monocrystalline substrate 15, etc.

According to the fifth embodiment, the laser beam applying unit 40 also has a spatial light modulator, not illustrated, as is the case with the laser beam applying unit 28. The spatial light modulator can also vary the power density distribution of the laser beam $L_B$ within an irradiation area that is irradiated by the laser beam $L_B$. The irradiation area that is irradiated by the laser beam $L_B$ is a circular area having a diameter of approximately 70 μm, for example. In a method of manufacturing the LED display panel 27 according to the fifth embodiment, the LED wafer holding step S10, the circuit board holding step S20, and the positioning step S30 are carried out by using the red LED wafer 13 and the circuit board 11.

Figure 16A:
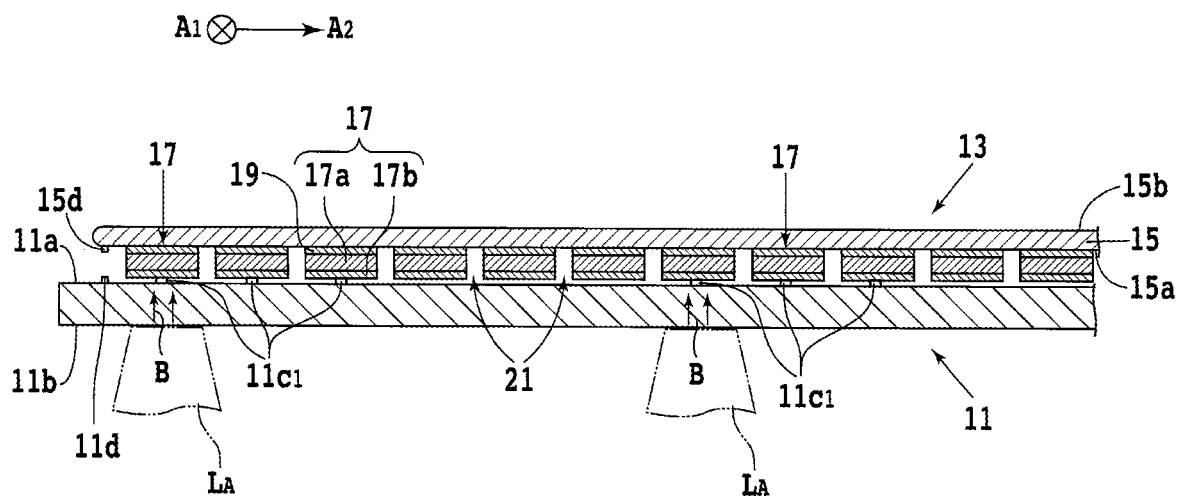
FIG. 16A is a fragmentary cross-sectional view illustrating an electrode joining step according to the fifth embodiment.

Then, as with the first embodiment, the electrode joining step S40 and the buffer layer breaking step S50 are carried out. FIG. 16A illustrates, in fragmentary cross section, the electrode joining step S40 according to the fifth embodiment. In the electrode joining step S40 according to the fifth embodiment, the laser beam $L_A$ is simultaneously applied through the spatial light modulator 28d to areas of the reverse side 11b of the circuit board 11 that correspond to the electrodes $11c_1$ held in contact with the red LED 17 on the leftmost side in FIG. 16A and the seventh red LED 17 from the leftmost side in FIG. 16A.

The simultaneously applied laser beam $L_A$ heats two electrodes $11c_1$. Note that the laser beam $L_A$ may heat two electrodes $11c_1$ and $11c_2$ that are arrayed in the row direction $A_1$. The positions at which the laser beam $L_A$ is applied are not limited to the above examples, and may be adjusted by making suitable settings for the operation of the spatial light modulator 28d. According to the fifth embodiment, at red LEDs 17 that are spaced from one another by a distance covering five red LEDs 17 along the column direction $A_2$, an anode electrode layer 17b is electrically joined to one electrode $11c_1$, and a cathode electrode layer is electrically joined to one electrode $11c_2$.

Figure 16B:
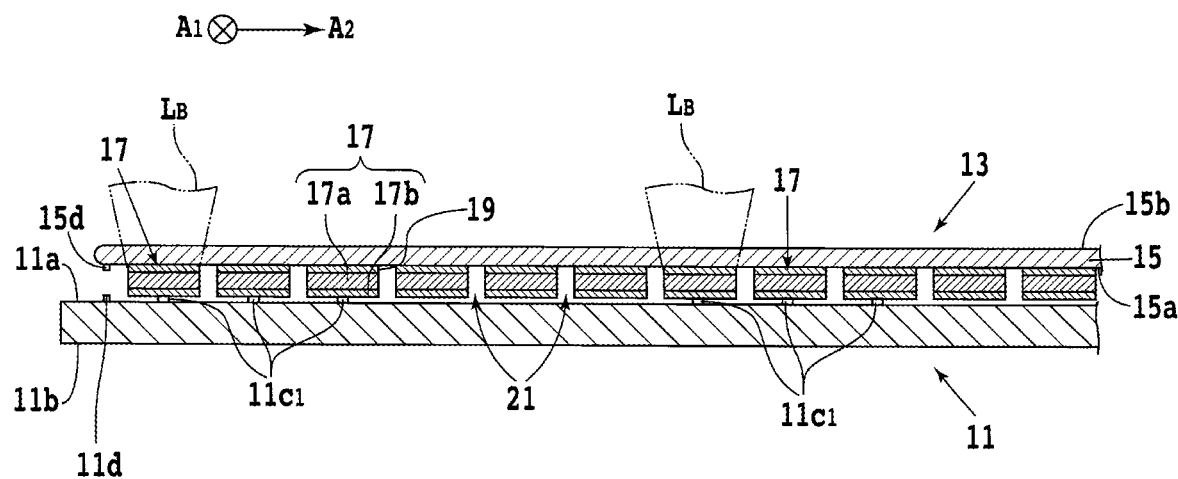
FIG. 16B is a fragmentary cross-sectional view illustrating a buffer layer breaking step according to the fifth embodiment.

According to the fifth embodiment, the degree of freedom in designing the circuit board 11 is increased compared with the case where the electrode joining step S40 is carried out with a laser beam having a wavelength transmittable through the circuit board 11. In addition, the power density distribution of the laser beam $L_A$ is adjusted to achieve higher productivity as well as the higher degree of freedom in designing the circuit board 11. After the electrode joining step S40, the buffer layer breaking step S50 is carried out. FIG. 16B illustrates, in fragmentary cross section, the buffer layer breaking step S50 according to the fifth embodiment.

In the buffer layer breaking step S50 according to the fifth embodiment, the laser beam $L_B$ is simultaneously applied through the spatial light modulator to buffer layers 19 corresponding to the red LED 17 on the leftmost side in FIG. 16B and the seventh red LED 17 from the leftmost side in FIG. 16B, thereby simultaneously breaking the buffer layers 19. Alternatively, the laser beam $L_B$ may simultaneously be applied to break a plurality of buffer layers 19 that are arrayed in the row direction $A_1$. The positions at which the laser beam $L_B$ is applied are not limited to the above examples, and may be adjusted by making suitable settings for the operation of the spatial light modulator. According to the fifth embodiment, the laser beam $L_B$ is applied to break buffer layers 19 that are spaced from one another by a distance covering five red LEDs 17 in the column direction $A_2$. Note that the buffer layer breaking step S50 may precede the electrode joining step S40.

In the embodiments described above, the heat generated when the laser beam $L_A$ is absorbed by the circuit board 11 or the red LED wafer 13 heats the electrodes $11c_1$ and $11c_2$. Alternatively, the anode electrode layers 17b and the cathode electrode layers may be heated to heat and melt the electrodes $11c_1$ and $11c_2$. In other words, the laser beam $L_A$ may be applied to heat the electrodes $11c_1$ and $11c_2$ or the anode electrode layers 17b and the cathode electrode layers, or heat the electrodes $11c_1$ and $11c_2$, the anode electrode layers 17b, and the cathode electrode layers. The details of the structures and methods according to the above embodiments may be modified without departing from the scope of the invention. For example, the positioning step S30 may be carried out in manners different from the details described above, i.e., according to first through fourth modifications to be described below.

(First Modification)

The circuit board 11 and the red LED wafer 13 may be positioned with respect to each other while a camera unit disposed above the monocrystalline substrate 15 simultaneously observes light that has a wavelength transmittable through the monocrystalline substrate 15, e.g., infrared light, visible light, or the like, and that is reflected from the alignment marks 11d and 15d (first reflected light method).

(Second Modification)

Instead, the circuit board 11 and the red LED wafer 13 may be positioned with respect to each other while a camera unit disposed below the circuit board 11 simultaneously observes light that has a wavelength transmittable through the circuit board 11, e.g., infrared light or the like, and that is reflected from the alignment marks 11d and 15d (second reflected light method).

(Third Modification)

Alternatively, a camera unit that is disposed above the monocrystalline substrate 15 and a light source that is disposed below the circuit board 11 and that emits light having a wavelength transmittable through the circuit board 11 and the monocrystalline substrate 15, e.g., infrared light or the like, may be used (first transmitted light method). According to the first transmitted light method, the circuit board 11 and the red LED wafer 13 are positioned with respect to each other while the camera unit observes light emitted upwardly from the light source below the circuit board 11 and transmitted through the circuit board 11 and the monocrystalline substrate 15, thereby simultaneously observing the alignment marks 11d and 15d.

(Fourth Modification)

Instead, a camera unit that is disposed below the monocrystalline substrate 15 and a light source that is disposed above the circuit board 11 and that emits light having a wavelength transmittable through the circuit board 11 and the monocrystalline substrate 15, e.g., infrared light or the like, may be used (second transmitted light method). According to the second transmitted light method, the circuit board 11 and the red LED wafer 13 are positioned with respect to each other while the camera unit observes light emitted downwardly from the light source above the circuit board 11 and transmitted through the circuit board 11 and the monocrystalline substrate 15, thereby simultaneously observing the alignment marks 11d and 15d.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a light emitting diode display panel by placing a plurality of light emitting diodes in a predetermined layout on a circuit board having a circuit for driving the light emitting diodes, the method comprising:

a light emitting diode wafer holding step of holding, on a first holding unit, a light emitting diode wafer including a substrate and a plurality of light emitting diodes, the light emitting diode wafer having a plurality of areas demarcated on a face side of the substrate by a plurality of element separating lines, each of the plurality of light emitting diodes being disposed in each of the areas such that a buffer layer is positioned adjacent to the substrate and the electrode layer is positioned on each of the light emitting diodes on a side opposite to the buffer layer;

a circuit board holding step of holding, on a second holding unit, a circuit board having a plurality of electrodes arranged in rows and columns on a face side thereof;

a positioning step of positioning each of the electrodes of the circuit board at a position corresponding to the electrode layer of the light emitting diode wafer while the face side of the circuit board and the face side of the substrate of the light emitting diode wafer are facing each other;

an electrode joining step of joining the electrode layer of the light emitting diode wafer and the electrode of the circuit board to each other by applying a laser beam to a surface of a reverse side of one of the circuit board and the light emitting diode wafer, thereby absorbing the laser beam in the one of the circuit board and the light emitting diode wafer and heating at least either the electrode layer of the light emitting diode wafer or the electrode of the circuit board, with heat generated by the absorbed laser beam, through the one of the circuit board and the light emitting diode wafer in an irradiation area irradiated by the laser beam;

a buffer layer breaking step of breaking the buffer layer by applying a pulsed laser beam to a surface of, and transmitting the laser beam through, the substrate of the light emitting diode wafer, to reach the buffer layer through the reverse side of the light emitting diode wafer that faces the circuit board in the positioning step; and a peeling step of peeling off the substrate from the light emitting diode after the buffer layer breaking step.

2. The method of manufacturing a light emitting diode display panel according to claim 1, wherein the electrode joining step includes a step of simultaneously heating at least either a plurality of the electrode layers of the light emitting diode wafer or the plurality of electrodes of the circuit board by using a spatial light modulator to vary a power density distribution of the laser beam within the irradiation area irradiated by the laser beam.

\* \* \* \* \*